United States Patent
Yagi et al.

(10) Patent No.: US 8,022,472 B2
(45) Date of Patent: Sep. 20, 2011

(54) SEMICONDUCTOR DEVICE AND METHOD OF MANUFACTURING SEMICONDUCTOR DEVICE

(75) Inventors: Ryotaro Yagi, Kyoto (JP); Isamu Nishimura, Kyoto (JP); Takahisa Yamaha, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 243 days.

(21) Appl. No.: 12/314,067

(22) Filed: Dec. 3, 2008

(65) Prior Publication Data

US 2009/0140330 A1    Jun. 4, 2009

(30) Foreign Application Priority Data

Dec. 4, 2007  (JP) .................................. 2007-313689
Dec. 20, 2007 (JP) .................................. 2007-329116
Dec. 25, 2007 (JP) .................................. 2007-332681

(51) Int. Cl.
*H01L 29/41* (2006.01)
*H01L 29/423* (2006.01)

(52) U.S. Cl. ................ 257/330; 257/332; 257/E29.135; 438/592

(58) Field of Classification Search .................. 257/330, 257/332, 334, E29.135; 438/589, 592
See application file for complete search history.

(56) References Cited

U.S. PATENT DOCUMENTS

| | | | | |
|---|---|---|---|---|
| 5,300,447 A | * | 4/1994 | Anderson | 438/282 |
| 5,405,794 A | * | 4/1995 | Kim | 438/270 |
| 5,897,343 A | * | 4/1999 | Mathew et al. | 438/133 |
| 2002/0100934 A1 | | 8/2002 | Nakagawa et al. | |

FOREIGN PATENT DOCUMENTS

| | | |
|---|---|---|
| JP | 2001-036074 | 2/2001 |
| JP | 2002-305305 | 10/2002 |
| JP | 2007-258501 | 10/2007 |

* cited by examiner

*Primary Examiner* — Mary Wilczewski
(74) *Attorney, Agent, or Firm* — Rabin & Berdo, PC

(57) ABSTRACT

The semiconductor device according to the present invention includes a semiconductor layer, a trench formed by digging the semiconductor layer from the surface thereof, a gate insulating film formed on the inner surface of the trench, and a gate electrode made of silicon embedded in the trench through the gate insulating film. The gate electrode has a high-conductivity portion formed to cover the gate insulating film with a relatively high conductivity and a low-conductivity portion formed on a region inside the high-conductivity portion with a relatively low conductivity.

7 Claims, 26 Drawing Sheets

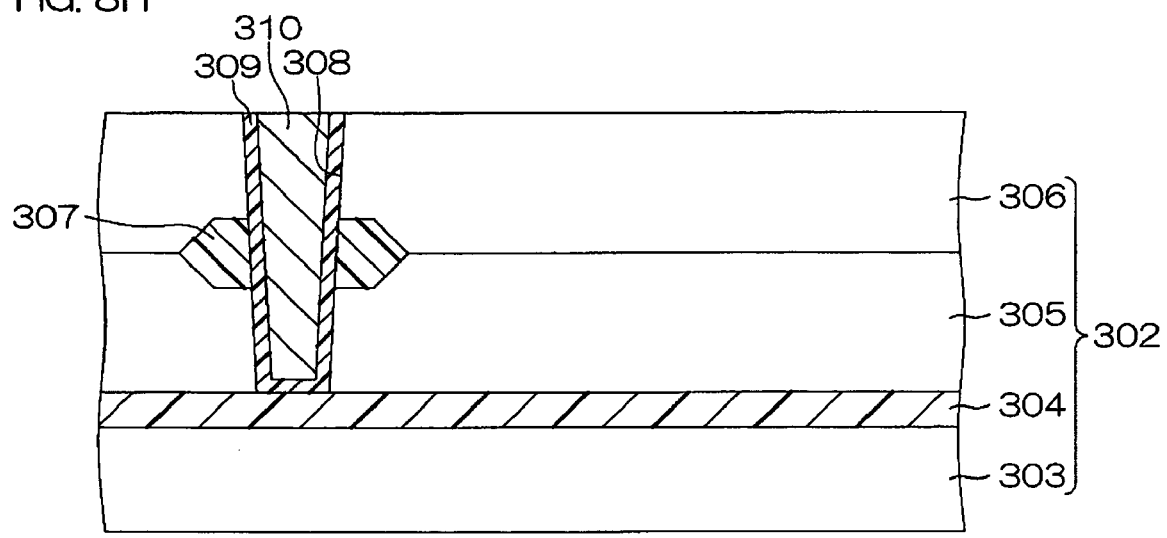

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a method of manufacturing a semiconductor device.

2. Description of Related Art

A trench gate structure is generally known as a structure effective for refinement of a VDMOSFET (Vertical Double diffused Metal Oxide Semiconductor Field-Effect Transistor).

FIG. 9 is a schematic sectional view showing the structure of a conventional semiconductor device including a trench gate type VDMOSFET.

A semiconductor device 401 shown in FIG. 9 includes an $N^+$-type (high-concentration N-type) substrate 402. An $N^-$-type (low-concentration N-type) epitaxial layer 403 is laminated on the $N^+$-type substrate 402. A base layer portion of the $N^-$-type epitaxial layer 403 forms an $N^-$-type region 404. A $P^-$-type body region 405 is formed on a surface layer portion of the $N^-$-type epitaxial layer 403 vertically adjacently to the $N^-$-type region 404.

A first trench 406 and a second trench 407 smaller in width than the first trench 406 are formed in the $N^-$-type epitaxial layer 403.

The first trench 406 is dug in the $P^-$-type body region 405 from the surface thereof to penetrate through the $P^-$-type body region 405, so that the deepest portion thereof reaches the $N^-$-type region 404. A gate insulating film 408 made of $SiO_2$ (silicon oxide) is formed in the first trench 406, to cover the inner surface thereof. A gate electrode 409 made of polysilicon (doped polysilicon) doped with an N-type impurity in a high concentration is embedded inside of the gate insulating film 408.

The second trench 407 is also dug in the $P^-$-type body region 405 from the surface thereof to penetrate through the $P^-$-type body region 405, so that the deepest portion thereof reaches the $N^-$type region 404. A gate insulating film 410 made of $SiO_2$ is formed in the second trench 407, to cover the inner surface thereof. A gate electrode 411 made of doped polysilicon is embedded inside of the gate insulating film 410.

$N^+$-type source regions 412 are formed on a surface layer portion of the $P^-$-type body region 405. Further, $P^+$-type body contact regions 413 are formed on a surface layer portion of the $P^-$-type body region 405, to penetrate through the $N^+$-type source regions 412.

A drain electrode 414 is formed on the back surface of the $N^+$-type substrate 402.

An interlayer dielectric film (not shown) is laminated on the $N^-$-type epitaxial layer 403. A gate wire (not shown) prepared from an Al (aluminum) alloy wire, for example, is formed on the interlayer dielectric film. In the interlayer dielectric film, a contact hole (not shown) is penetratingly formed on a portion where the gate wire and the gate electrode 409 are opposed to each other, so that the gate electrode 409 and the gate wire are in contact (electrically connected) with each other through this contact hole.

The gate electrodes 409 and 411 may be formed by filling up the first and second trenches 406 and 407 with non-doped polysilicon (polysilicon doped with no impurity) and implanting an impurity into this non-doped polysilicon respectively.

More specifically, an oxide film is formed on the surface of the $N^-$-type epitaxial layer 403 including the inner surfaces of the first and second trenches 406 and 407. A deposition layer of non-doped polysilicon is formed on the oxide film, with a thickness for filling up the first trench 406. Thereafter the impurity is implanted into a surface layer portion of the deposition layer of non-doped polysilicon. After this implantation of the impurity, a heat treatment is performed. Thus, the deposition layer of non-doped polysilicon is converted to a deposition layer of doped polysilicon. Thereafter portions of the deposition layer of doped polysilicon located outside the first and second trenches 406 and 407 are removed by etch-back, so that the gate electrodes 409 and 411 made of doped polysilicon are formed in the first and second trenches 406 and 407 respectively.

However, the impurity is implanted from the surface of the deposition layer of non-doped polysilicon, and hence the impurity concentrations of the gate electrodes 409 and 411 are sloped to lower toward deep positions thereof. Therefore, the gate electrodes 409 and 411 disadvantageously exhibit relatively large resistances, due to low conductivities on the bottom portions thereof.

In order to solve this problem, the time for implanting the impurity may be so set as to sufficiently implant the impurity up to the bottom portions of the gate electrodes 409 and 411. In this case, however, an extremely long time is required for implanting the impurity.

On the other hand, the conductivities of the gate electrodes 409 and 411 may be increased by another method of forming the gate electrodes 409 and 411. According to this method, a deposition layer of doped polysilicon having a thickness for filling up the first trench 406 is formed on an oxide film provided on the surface of the $N^-$-type epitaxial layer 403 by depositing polysilicon while doping the same with an impurity. Thereafter portions of the deposition layer of doped polysilicon located outside the first and second trenches 406 and 407 are removed by etch-back.

According to this method, however, silicon embeddability is deteriorated due to the width of the first trench 406 larger than that of the second trench 407. Therefore, a recess is formed on the surface of the deposition layer of doped polysilicon on a portion located above the wider first trench 406. The size of this recess is increased due to the step of etching back the deposition layer of doped polysilicon. Consequently, a large recess 415 is formed on the surface of the wider gate electrode 409, as shown in FIG. 9. When surface washing is performed by repeating oxidation and a hydrofluoric acid treatment after the formation of the gate electrode 409, the size of the recess 415 formed on the surface of the wide gate electrode 409 is further increased.

When the size of the recess 415 is increased, stress may be applied to the gate electrode 409 due to oxidation of the surface of the recess 415 in the surface washing, a crystal defect may be formed in the gate electrode 409. The crystal defect in the gate electrode 409 causes reduction in the source-drain withstand voltage.

When the large recess 415 is formed on the surface of the wider gate electrode 409, the distance from the surface of the interlayer dielectric film laminated on the $N^-$-type epitaxial layer 403 to the surface of the gate electrode 409 is increased. If an etching time for forming the contact hole is set with reference to the surface of the $N^-$-type epitaxial layer 403, therefore, the contact hole may not penetrate through the interlayer dielectric film, and a contact failure may be caused between the gate electrode 409 and the gate wire.

If the etching time for forming the contact hole is set with reference to the surface of gate electrode 409, on the other hand, the $N^-$-type epitaxial layer 403 (the $N^+$-type source regions 412 and the $P^+$-type body contact regions 413) may be dug down to cause the so-called junction leak when other contact holes for contact with the N+-type source regions 412 and the P+-type body contact regions 413 are formed in the interlayer dielectric film along with this contact hole.

While the surface of the deposition layer of doped polysilicon may conceivably be planarized by CMP (chemical mechanical polishing) so that no recess is formed on the surface of the gate electrode 409, the working cost is disadvantageously increased in this case due to increase in the number of the manufacturing steps.

The problem of the contact failure or the junction leak is not restricted to the structure having the first and second trenches 406 and 407 different in width from each other, but may also arise in a structure having trenches identical in width to each other.

FIG. 10 is a schematic sectional view showing the structure of another conventional semiconductor device including a trench gate type VDMOSFET.

A semiconductor device 501 shown in FIG. 10 includes an N+-type (high-concentration N-type) substrate 502. An N−-type (low-concentration N-type) epitaxial layer 503 is laminated on the N+-type substrate 502. A base layer portion of the N−-type epitaxial layer 403 forms an N−-type region 504. A P−-type body region 505 is formed on a surface layer portion of the N−-type epitaxial layer 503 vertically adjacently to the N−-type region 504.

A trench 506 is formed in the N−-type epitaxial layer 503. The trench 506 is dug in the P−-type body region 505 from the surface thereof to penetrate through the P−-type body region 505, so that the deepest portion thereof reaches the N−-type region 504. A gate insulating film 507 made of $SiO_2$ (silicon oxide) is formed in the trench 506, to cover the inner surface thereof. A gate electrode 508 made of polysilicon (doped polysilicon) doped with an N-type impurity in a high concentration is embedded inside of the gate insulating film 507.

N+-type source regions 509 are formed on a surface layer portion of the P−-type body region 505 along the trench 506. Further, P+-type body contact regions 510 are formed on a surface layer portion of the P−-type body region 505, to penetrate through the N+-type source regions 509.

An interlayer dielectric film (not shown) is laminated on the N−-type epitaxial layer 503. A gate wire (not shown) made of Al (aluminum), for example, is formed on the interlayer dielectric film. The gate wire is in contact (electrically connected) with the gate electrode 508 through a gate contact hole (not shown) formed in the interlayer dielectric film. Source wires (not shown) are electrically connected to the N+-type source regions 509 and the P+-type body contact regions 510 through source contact holes (not shown) formed in the interlayer dielectric film.

A drain electrode 511 is formed on the back surface of the N+-type substrate 502.

In order to manufacture the semiconductor device 501, a silicon oxide film is formed on the surface of the N−-type epitaxial layer 503 including the inner surface of the trench 506. A deposition layer of doped silicon is formed on the silicon oxide film. The deposition layer of doped silicon is formed with a thickness for filling up the trench 506 and covering portions of the silicon oxide film located outside the trench 506. Thereafter portions of the deposition layer of doped silicon located outside the trench 506 are removed by etch-back. Thus, the gate electrode 508 made of doped silicon is formed in the trench 506.

However, the deposition layer of doped silicon grows at the same rate on the overall surface of the N−-type epitaxial layer 503 including the side surface of the trench 506. Therefore, a recess is formed on a portion of the surface of the deposition layer of doped silicon located above the trench 506. The size of this recess is increased due to the step of etching back the deposition layer of doped silicon. Consequently, a large recess 512 is formed on the surface of the gate electrode 508, as shown in FIG. 10. When surface washing is performed by repeating oxidation and a hydrofluoric acid treatment after the formation of the gate electrode 508, the size of the recess 512 formed on the surface of the gate electrode 508 is further increased.

When the large recess 512 is formed on the surface of the gate electrode 508, the distance from the surface of the interlayer dielectric film laminated on the N−-type epitaxial layer 503 to the surface (recess 512) of the gate electrode 508 is increased. If an etching time for forming the gate contact hole is set with reference to the surface of the N−-type epitaxial layer 503, therefore, the gate contact hole may not penetrate through the interlayer dielectric film, and a contact failure may be caused between the gate electrode 508 and the gate wire.

If the etching time for forming the gate contact hole is set with reference to the bottom surface of the recess 512, on the other hand, the source contact holes for contact with the N+-type source regions 509 (or the P+-type body contact regions 510) may penetrate through the N+-type source regions 509 and reach the P−-type body region 505 when the same are formed in the interlayer dielectric film along with the gate contact hole, to disadvantageously cause the so-called junction leak.

A DTI (Deep Trench Isolation) technique is known as an element isolation technique for electrically isolating a region provided with a high withstand voltage element such as a high withstand voltage MOSFET (Metal Oxide Semiconductor Field-Effect Transistor) from a region provided with another element when the high withstand voltage element and the other element are mixedly provided on a semiconductor substrate.

FIG. 11 is a schematic sectional view showing the structure of a conventional semiconductor substrate provided with a high withstand voltage element.

The semiconductor substrate is formed by a thick-film SOI (Silicon On Insulator) substrate 601, for example. The thick-film SOI substrate 601 has a structure obtained by laminating an N-type epitaxial layer 604 made of Si (silicon) on a P- or N-type silicon substrate 602 through a BOX (Buried Oxide) layer 603 made of $SiO_2$ (silicon oxide)

A deep trench 605 in the form of a quadrangular ring in plan view is dug in the epitaxial layer 604 from the surface thereof. The deepest portion of the deep trench 605 reaches the BOX layer 603. The deep trench 605 is filled up with polysilicon 607 through an oxide film 606 made of $SiO_2$. A high withstand voltage element (not shown) such as a high withstand voltage MOSFET is formed on a region surrounded by the deep trench 605.

Thus, in the semiconductor device to which the DTI technique is applied, a region surrounded by the deep trench 605 filled up with the polysilicon 607 serves as an element forming region isolated (dielectrically isolated) from the periphery thereof.

In the steps of manufacturing the semiconductor device, an impurity is implanted into the epitaxial layer 604 for forming an impurity diffusion region (source region of the high withstand voltage MOSFET or the like, for example) in the element forming region, and a heat treatment is thereafter performed for activating the impurity. Further, another heat treatment is performed for forming the oxide film 606. When these heat treatments are performed, difference is caused between the quantities of expansion of the epitaxial layer 604 and the oxide film 606 due to the difference between the thermal expansion coefficients of Si and $SiO_2$, and stress resulting from this difference is concentrated on portions around the upper and lower ends of the deep trench 605 in the epitaxial layer 604. When the heat treatments are repeated, therefore, crystal defects resulting from stress concentration may be formed around the upper and lower ends of the deep trench 605 in the epitaxial layer 604.

SUMMARY OF THE INVENTION

A first object of the present invention is to provide a semiconductor device having a structure capable of reducing the resistance of a gate electrode and preventing the surface of the gate electrode from formation of a large recess and a method of manufacturing the same.

A second object of the present invention is to provide a semiconductor device and a method of manufacturing the same capable of attaining excellent contact with a gate electrode without causing a junction leak.

A third object of the present invention is to provide a semiconductor device and a method of manufacturing the same capable of preventing formation of a crystal defect resulting from stress concentration.

A semiconductor device according to the present invention for attaining the first object includes: a semiconductor layer; a trench formed by digging the semiconductor layer from the surface thereof; a gate insulating film formed on the inner surface of the trench; and a gate electrode made of silicon embedded in the trench through the gate insulating film.

The gate electrode has a high-conductivity portion formed to cover the gate insulating film with a relatively high conductivity. Therefore, the gate electrode can exhibit a high conductivity on the overall region in the depth direction of the trench. Thus, the resistance of the gate electrode can be reduced.

The gate electrode has a low-conductivity portion having a relatively low conductivity on the inside of the high-conductivity portion. This gate electrode can be formed by forming the high-conductivity portion on the gate insulating film, thereafter depositing the material for the low-conductivity portion with a thickness for filling up the trench and etching back the deposition layer, for example. When a material such as non-doped polysilicon having a low impurity concentration is employed as the material for the low-conductivity portion, therefore, the surface of the low-conductivity portion can be prevented from formation of a large recess. Consequently, the surface of the gate electrode can be prevented from formation of a large recess.

Preferably, the high-conductivity portion is made of doped polysilicon doped with an impurity, and the low-conductivity portion is made of polysilicon having a lower impurity concentration than the doped polysilicon. In this case, the surface of the gate electrode can be prevented from formation of a large recess, as hereinabove described.

Preferably, the impurity concentration of the high-conductivity portion is uniform in the depth direction of the trench. In this case, the gate electrode can uniformly exhibit a high conductivity on the overall region in the depth direction of the trench. Consequently, the resistance of the gate electrode can be reduced, and excellent transistor performance can be exhibited.

A method of manufacturing a semiconductor device according to one aspect of the present invention for attaining the first object includes the steps of: forming a first trench and a second trench smaller in width than the first trench in a semiconductor layer; forming an oxide film on the surface of the semiconductor layer including the inner surfaces of the first trench and the second trench; forming a doped polysilicon layer made of doped polysilicon doped with an impurity on the oxide film with a thickness for leaving a space in the first trench while filling up the second trench; forming a non-doped polysilicon layer made of non-doped polysilicon doped with no impurity on the doped polysilicon layer with a thickness for filling up the space in the first trench; and removing the doped polysilicon layer and the non-doped polysilicon layer from on portions of the oxide layer located outside the first trench and the second trench by etch-back, for leaving the doped polysilicon layer and the non-doped polysilicon layer in the first trench while leaving the doped polysilicon layer in the second trench.

According to this method, the doped polysilicon layer having the thickness for leaving the space in the first trench is formed on the oxide film. Further, the non-doped polysilicon layer having the thickness for filling up the space in the first trench is formed on the doped polysilicon layer. Thereafter the doped polysilicon layer and the non-doped polysilicon layer are etched back.

In the formation of the non-doped polysilicon layer, the surfaces of films made of non-doped polysilicon come into contact with each other on the central portion of the trench. The non-doped polysilicon is doped with no impurity, and hence no impurity is present on the contact portions of the surfaces of the films. When the non-doped polysilicon layer is etched back, therefore, no rate difference is caused between these portions. Therefore, no recess or only a small recess is formed on a portion of the surface of the non-doped polysilicon layer located above the relatively wide first trench. Thus, no recess or only a small recess is formed on the surface of a gate electrode after the etch-back step.

Therefore, the surface of the gate electrode embedded in the first trench can be prevented from formation of a large recess. Consequently, the gate electrode can be prevented from formation of a crystal defect. Further, the surface of the gate electrode can be generally planarized, whereby a contact failure between the gate electrode and a gate wire as well as a junction leak resulting from digging of the semiconductor layer can be prevented.

The gate electrode formed in the first trench in this manner has a high-conductivity portion covering a gate insulating film. While the conductivity of the first trench itself is lower than that of the second trench due to this structure, the gate electrode connected/in contact with the gate wire is not influenced by this but can exhibit a high conductivity on the overall region.

Another gate electrode embedded in the second trench is formed by filling up the second trench with the doped polysilicon layer having a uniform impurity concentration, whereby the impurity concentration thereof is uniformized in the depth direction of the second trench.

Consequently, the resistances of the gate electrodes embedded in the first and second trenches can be reduced.

A method of manufacturing a semiconductor device according to another aspect of the present invention for attaining the first object includes the steps of: forming a first trench and a second trench smaller in width than the first trench in a semiconductor layer; forming an oxide film on the surface of the semiconductor layer including the inner surfaces of the first trench and the second trench; forming a first non-doped polysilicon layer made of non-doped polysilicon doped with no impurity on the oxide film with a thickness for leaving spaces in the first trench and the second trench respectively; converting the first non-doped polysilicon layer to a doped polysilicon layer by implanting an impurity into the first non-doped polysilicon layer; forming a second non-doped polysilicon layer made of non-doped polysilicon doped with no impurity on the doped polysilicon layer with a thickness for filling up the spaces in the first trench and the second trench respectively; and removing the doped polysilicon layer and the second non-doped polysilicon layer from on portions of the oxide film located outside the first trench and the second trench by etch-back, for leaving the doped polysilicon layer and the second non-doped polysilicon layer in the first trench and the second trench.

According to this method, the first non-doped polysilicon layer having the thickness for leaving the spaces in the first trench and the second trench respectively is formed on the oxide film. The doped polysilicon layer is formed in the first trench and the second trench by implanting the impurity into the first non-doped polysilicon layer. Then, the second non-doped polysilicon layer having the thickness for filling up the spaces in the first trench and the second trench respectively is formed on the doped polysilicon layer. Thereafter the doped polysilicon layer and the second non-doped polysilicon layer are etched back.

In the formation of the non-doped polysilicon layer, the surfaces of films made of non-doped polysilicon come into contact with one another on the central portions of the first and second trenches respectively. The non-doped polysilicon is doped with no impurity, and hence no impurity is present on the contact portions of the surfaces of the films. When the non-doped polysilicon layer is etched back, therefore, no rate difference is caused between these portions. Therefore, no recess or only a small recess is formed on a portion of the surface of the second non-doped polysilicon layer located above the relatively wide first trench. Thus, no recess or only a small recess is formed on the surface of a gate electrode after the etch-back step.

Therefore, the surface of the gate electrode embedded in the first trench can be prevented from formation of a large recess. Consequently, the gate electrode can be prevented from formation of a crystal defect. Further, the surface of the gate electrode can be generally planarized, whereby a contact failure between the gate electrode and a gate wire as well as a junction leak resulting from digging of the semiconductor layer can be prevented.

The gate electrode and another gate electrode formed in the first and second trenches respectively have high-conductivity portions covering gate insulating films. Therefore, the gate electrode formed in the first trench can exhibit a high conductivity on the overall region in the depth direction of the first trench. Further, the gate electrode formed in the second trench can also exhibit a high conductivity on the overall region in the depth direction of the second trench.

Consequently, the resistances of the gate electrodes embedded in the first and second trenches can be reduced.

A semiconductor device according to the present invention for attaining the second object includes: a semiconductor layer made of silicon; a trench formed by digging the semiconductor layer from the surface thereof; a gate insulating film made of silicon oxide formed on the inner surface of the trench; and a gate electrode, made of silicon doped with an impurity, embedded in the trench through the gate insulating film.

A protrusion is formed on the surface of the gate electrode. Even if a portion of the surface of the gate electrode around the protrusion is positioned lower than the surface of the semiconductor layer, therefore, a contact hole formed in an interlayer dielectric film laminated on the semiconductor layer for attaining contact with the gate electrode can reliably reach the gate electrode when the etching time (quantity) for forming the contact hole is set with reference to the forward end of the protrusion.

If another contact hole for attaining contact with the semiconductor layer (source region) is formed by etching in the same step along with the contact hole for attaining contact with the gate electrode, the etching time is set with reference to the surface of the semiconductor layer, so that the contact hole for attaining contact with the gate electrode can reach the gate electrode while the semiconductor layer (source region) can be prevented from remarkable digging.

Therefore, excellent contact with the gate electrode can be attained without causing a junction leak.

Preferably, the protrusion protrudes outward from an inner portion of the trench, so that the forward end thereof reaches a portion located outside the trench. In this case, the contact hole can reliably reach the protrusion of the gate electrode without digging the semiconductor layer when an etching time (quantity) for forming the contact hole is set with reference to the surface of the semiconductor layer. Consequently, excellent contact with the gate electrode can be attained while reliably preventing a junction leak.

The semiconductor device capable of attaining the second object can be manufactured by a method including the steps of: forming a trench in a semiconductor layer made of silicon; forming a silicon oxide film on the surface of the semiconductor layer including the inner surface of the trench; forming a doped silicon layer made of doped silicon doped with an impurity on the silicon oxide film with a thickness for filling up the trench; forming an etching suppression layer made of a material having a lower etching rate than the doped silicon on the doped silicon layer; removing the etching suppression layer by etch-back until the surface of the doped silicon layer is exposed, to partially leave the etching suppression layer on a position of the surface of the doped silicon layer opposed to the trench; and removing the etching suppression layer and the doped silicon layer by etch-back, to partially leave the doped silicon layer in the trench.

According to this method, the doped silicon layer having the thickness for filling up the trench is formed on the silicon oxide film, and thereafter etched back. Thus, the doped silicon layer is embedded in the trench. On the surface of the doped silicon layer formed in this manner, a recess is formed on the position opposed to the trench. Thereafter the etching suppression layer is formed on the doped silicon layer, and etched back until the surface of the doped silicon layer is exposed. Thus, the etching suppression layer formed on the doped silicon layer is left in the recess, while the remaining portion thereof is removed.

Thereafter the doped silicon layer and the etching suppression layer are etched back. The etching suppression layer is etched back at a lower etching rate than the doped silicon layer. Therefore, the region having the etching suppression layer embedded therein causes smaller film loss than the region having no etching suppression layer provided thereon. Further, the region of the etching suppression layer having a larger thickness causes smaller film loss than the region having a smaller thickness. Therefore, a protrusion is formed on the surface of the doped silicon layer after the etch-back step. Consequently, the semiconductor device capable of attaining the second object can be obtained.

A semiconductor device according to the present invention for attaining the third object includes: a first silicon layer; a second silicon layer laminated on the first silicon layer; a stress relaxation layer formed on the interface between the first silicon layer and the second silicon layer; a trench formed by digging the second silicon layer from the upper surface thereof to penetrate through the stress relaxation layer; and an SiO$_2$ film covering the inner surface of the trench.

According to this structure, the second silicon layer is laminated on the first silicon layer. The stress relaxation layer is formed on the interface between the first and second silicon layers. The trench is formed by digging the second silicon layer from the upper surface thereof, to penetrate through the stress relaxation layer. The inner surface of the trench is covered with the SiO$_2$ film.

In the steps of manufacturing the semiconductor device, a heat treatment for activating an impurity and another heat treatment (thermal oxidation) for forming an oxide film are performed. In these heat treatments, the first and second silicon layers, the stress relaxation layer and the SiO$_2$ film are expanded/contracted. At this time, difference is caused between the quantities of expansion of the first and second silicon layers and the SiO$_2$ film due to the difference between the thermal expansion coefficients of Si forming the first and second silicon layers and SiO$_2$ forming the SiO$_2$ film. However, the stress relaxation layer made of SiO$_2$ is so interposed between the first and second silicon layers that the difference between the quantities of expansion is absorbed (relaxed) due to expansion of the stress relaxation layer. Therefore, the first and second silicon layers can be prevented from application of stress resulting from the difference between the quantities of expansion of the first and second silicon layers and the SiO$_2$ film.

Further, the stress relaxation layer partitions the interfaces between the first and second silicon layers and the SiO$_2$ film. Even if the stress relaxation layer cannot completely absorb the difference between the quantities of expansion of the first and second silicon layers and the SiO$_2$ film, therefore, stress resulting from the difference between the quantities of expansion is dispersively applied to portions around the interfaces between a surface layer portion and a base layer portion of the first silicon layer and the SiO$_2$ film and those around the interfaces between a surface layer portion and a base layer portion of the second silicon layer and the SiO$_2$ film.

Thus, formation of crystal defects resulting from stress concentration in the first and second silicon layers can be prevented.

Preferably, the stress relaxation layer is made of SiO$_2$. In this case, the stress relaxation layer can be easily formed by selectively oxidizing the surface of the first silicon layer.

The semiconductor device capable of attaining the third object can be manufactured by a method including the steps of: forming a first silicon layer; selectively forming a stress relaxation layer on the first silicon layer; laminating a second silicon layer on the first silicon layer and the stress relaxation layer; forming a trench penetrating through the stress relaxation layer in the thickness direction thereof by digging the second silicon layer from the upper surface thereof; and covering the inner surface of the trench with an SiO$_2$ film.

The foregoing and other objects, features and effects of the present invention will become more apparent from the following detailed description of the embodiments with reference to the attached drawings.

BRIEF DESCRIPTION OF THE DRAWINGS

FIG. 8H is a schematic sectional view of a step subsequent to that of FIG. 8G.

DETAILED DESCRIPTION OF PREFERRED EMBODIMENTS

Figure 1:
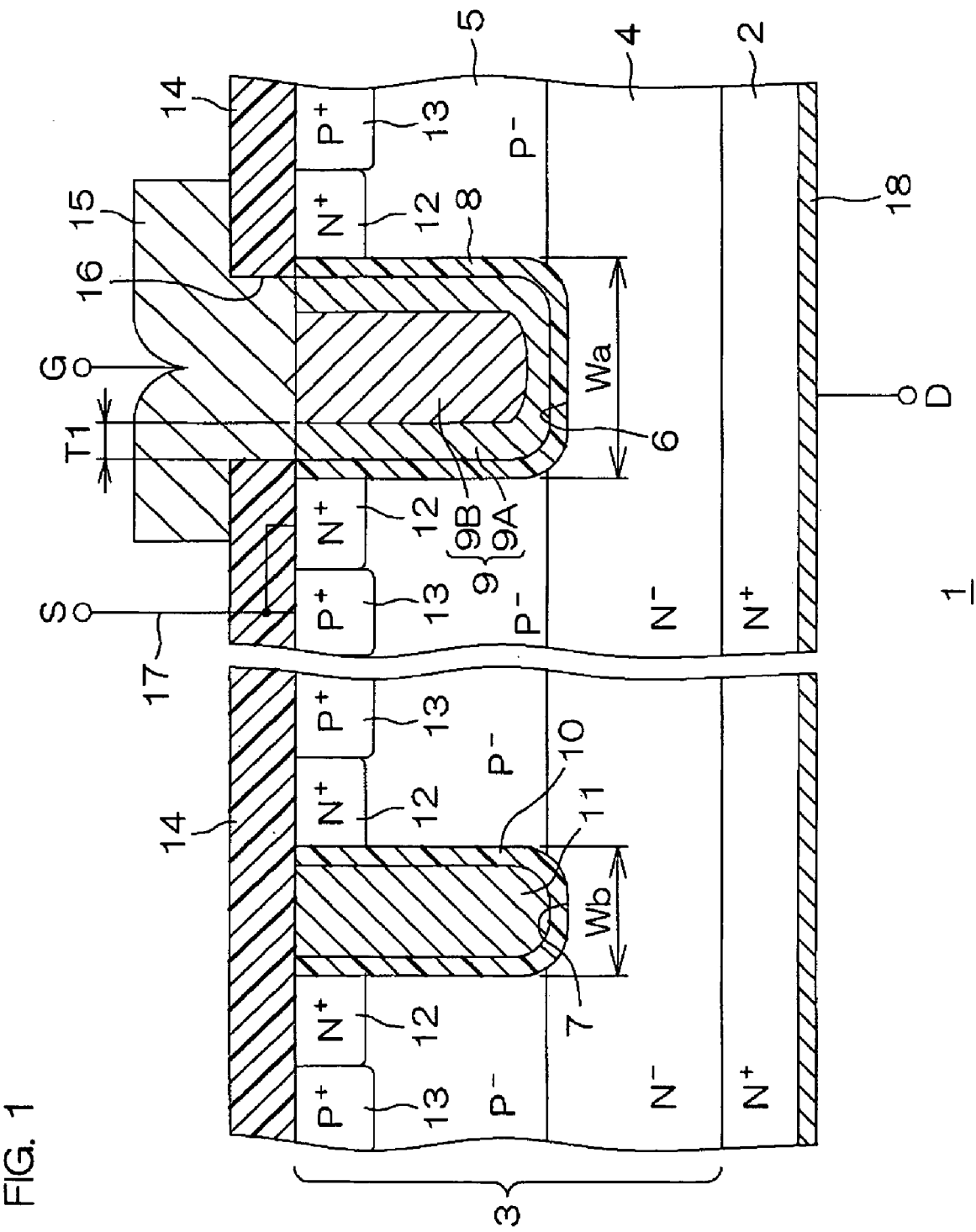
FIG. 1 is a sectional view schematically showing the structure of a semiconductor device according to a first embodiment of the present invention.

FIG. 1 is a sectional view schematically showing the structure of a semiconductor device 1 according to a first embodiment of the present invention.

On an $N^+$-type semiconductor substrate 2 forming a base of the semiconductor device 1, an $N^-$-type epitaxial layer 3 as a semiconductor layer made of silicon doped with an N-type impurity in a lower concentration ($10^{16}/cm^3$, for example) than the $N^+$-type semiconductor substrate 2 is laminated. A base layer portion of the epitaxial layer 3 keeps the state after epitaxy, and forms an $N^-$-type region 4. In the epitaxial layer 3, a $P^-$-type body region 5 is formed on the $N^-$-type region 4 in contact with the $N^-$-type region 4.

A first trench 6 having a relatively large width. Wa (0.8 μm, for example) and a second trench 7 having a relatively small width Wb (0.3 μm, for example) are formed in the epitaxial layer 3. The depth of each of the trenches 6 and 7 is set to 1.0 μm, for example.

The first trench 6 penetrates through the body region 5, so that the deepest portion thereof reaches the $N^-$-type region 4. A gate insulating film 8 made of $SiO_2$ is formed in the first trench 6, to cover the overall inner surface thereof. A first gate electrode 9 is embedded in the first trench 6 through the gate insulating film 8.

The first gate electrode 9 includes a high-concentration portion (high-conductivity portion) 9A made of doped polysilicon doped with an N-type impurity in a high concentration ($10^{20}/cm^3$, for example) and a low-concentration portion (low-conductivity portion) 9B made of doped polysilicon having a lower N-type impurity concentration ($10^{17}/cm^3$, for example) than the high-concentration portion 9A.

The high-concentration portion 9A is in the form of a thin film formed on the gate insulating film 8, and the thickness T1 thereof is set to 0.2 μm, for example. The low-concentration portion 9B is formed on a region inside the high-concentration portion 9A. The N-type impurity contained in the high- and low-concentration portions 9A and 9B can be prepared from P (phosphorus) or As (arsenic), for example.

The second trench 7 penetrates through the body region 5, so that the deepest portion thereof reaches the $N^-$-type region 4. A gate insulating film 10 made of $SiO_2$ is formed in the second trench 7, to cover the overall inner surface thereof. In the second trench 7, a second gate electrode 11 is embedded inside the gate insulating film 10.

The second gate electrode 11 is made of polysilicon doped with an N-type impurity in a high concentration ($10^{20}/cm^3$, for example). The N-type impurity contained in the second gate electrode 11 can be prepared from P (phosphorus) or As (arsenic), for example.

On a surface layer portion of the epitaxial layer 3, $N^+$-type source regions 12 each having a higher N-type impurity concentration ($10^{20}/cm^3$, for example) than the $N^-$-type region 4 are formed on both sides in a direction (horizontal direction in FIG. 1) orthogonal to the gate width with respect to the trenches 6 and 7. The source regions 12 extend in the direction along the gate width along the trenches 6 and 7, so that the bottom portions thereof are in contact with the body region 5. $P^+$-type body contact regions 13 are formed in the central portions of the source regions 12 in the direction orthogonal to the gate width, to penetrate through the source regions 12.

An interlayer dielectric film 14 is formed on the epitaxial layer 3. A gate wire 15 made of Al, for example, is formed on the interlayer dielectric film 14. The gate wire 15 is in contact with the first gate electrode 9 through a contact hole 16 formed to vertically penetrate through the interlayer dielectric film 14.

A source wire 17 is electrically connected to the corresponding source region 12 and the corresponding body contact region 13 through a contact hole (not shown) formed in the interlayer dielectric film 14. The source wire 17 is grounded.

A drain electrode 18 is formed on the back surface of the $N^+$-type substrate 2.

A current can be fed between the source regions 12 and the drain electrode 18 by controlling the potentials of the gate electrodes 9 and 11 while applying a positive voltage of a proper level to the drain electrode 18 thereby forming a channel in a portion of the body region 5 around the interface between the same and the gate insulating film 8.

FIGS. 2A to 2I are schematic sectional views successively showing the steps of manufacturing the semiconductor device 1.

Figure 2A:
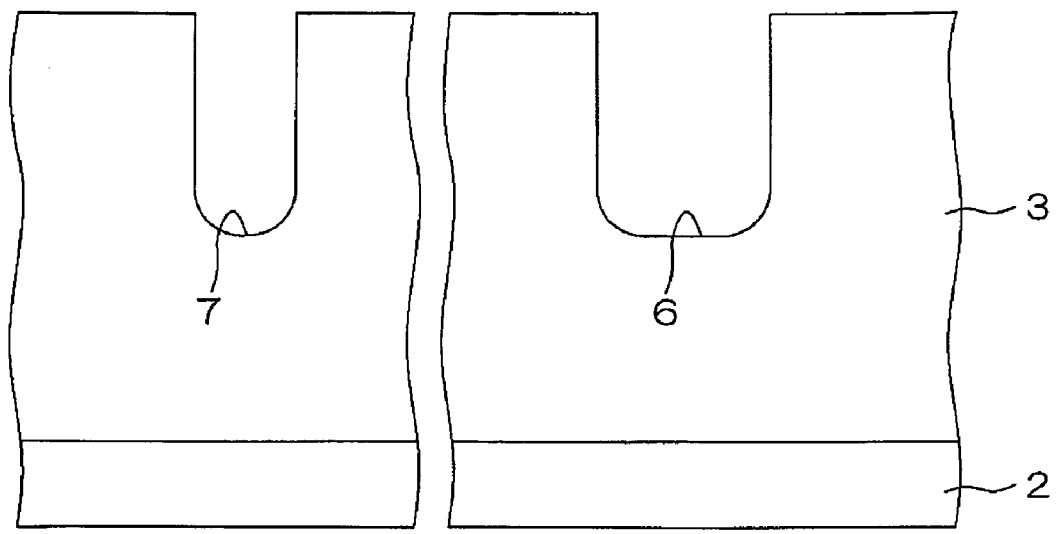
FIG. 2A is a schematic sectional view for describing a method of manufacturing the semiconductor device shown in FIG. 1.

First, the epitaxial layer 3 is formed on the $N^+$-type substrate 2 by epitaxy. Then, the first and second trenches 6 and 7 are formed in the epitaxial layer 3 by photolithography and etching, as shown in FIG. 2A.

Figure 2B:
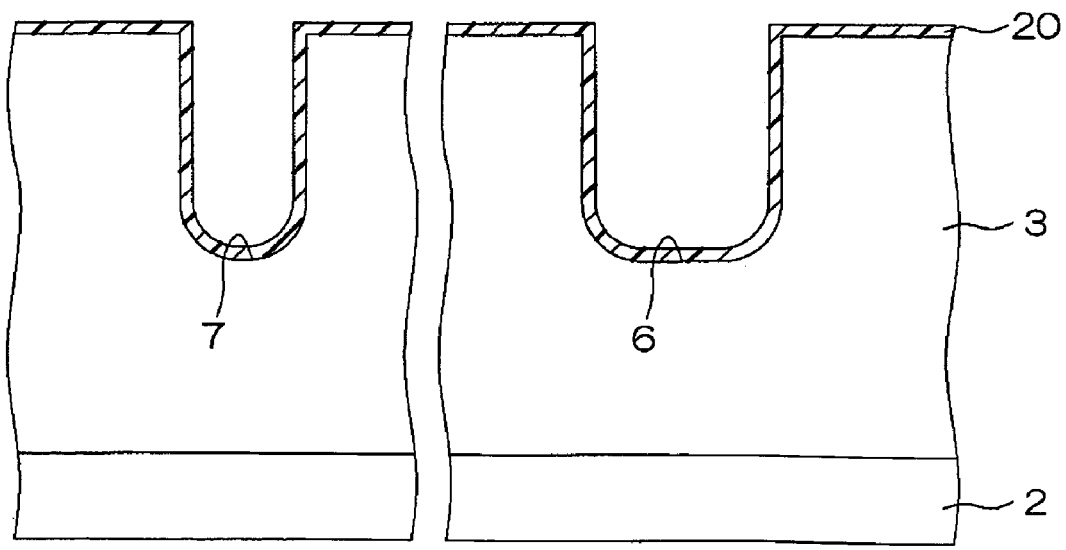
FIG. 2B is a schematic sectional view of a step subsequent to that of FIG. 2A.

Thereafter an oxide film 20 made of $SiO_2$ is formed on the surface of the epitaxial layer 3 and the inner surfaces of the first and second trenches 6 and 7 by thermal oxidation, as shown in FIG. 2B.

Figure 2C:
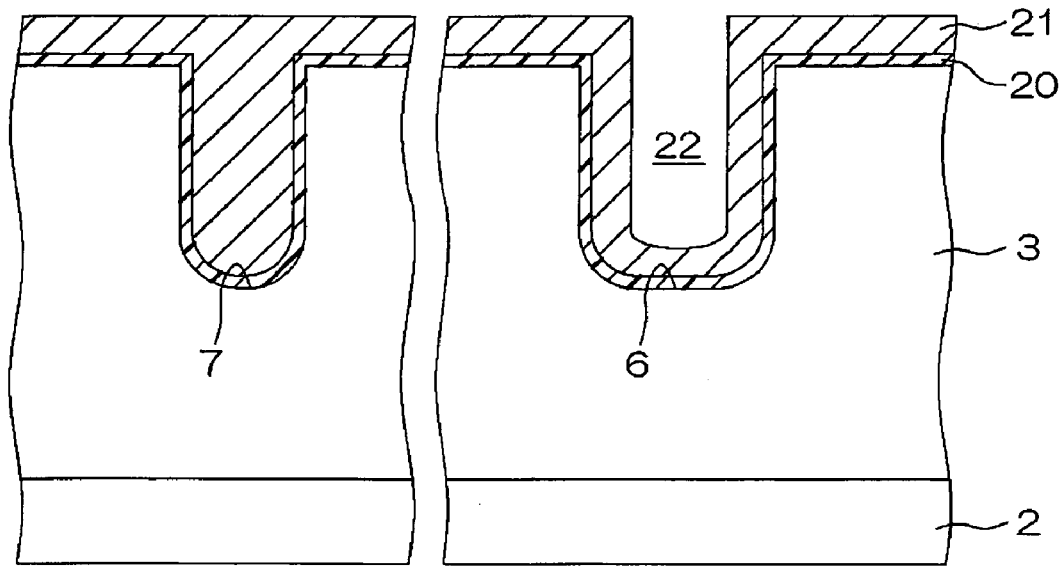
FIG. 2C is a schematic sectional view of a step subsequent to that of FIG. 2B.

Then, a doped polysilicon layer 21 which is a deposition layer of doped polysilicon doped with an N-type impurity in a high concentration is formed on the oxide film 20 by CVD, as shown in FIG. 2C. This doped polysilicon layer 21 fills up the second trench 7, without filling up the first trench 6. Therefore, a space 22 remains in the first trench 6. The doped polysilicon layer 21 is formed also on portions of the oxide film 20 located outside the first and second trenches 6 and 7.

Figure 2D:
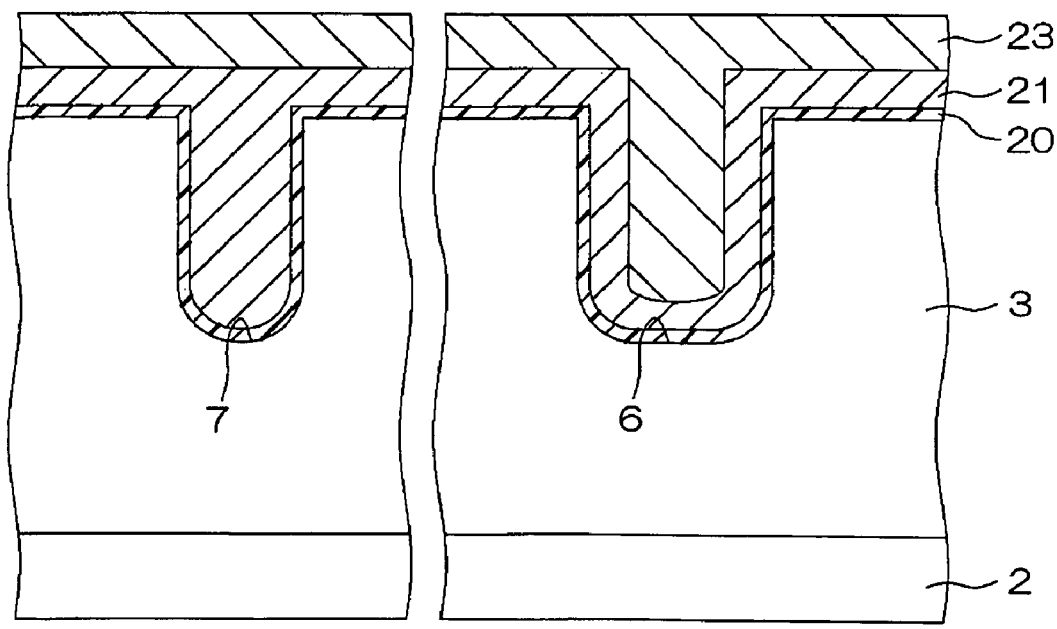
FIG. 2D is a schematic sectional view of a step subsequent to that of FIG. 2C.

Then, a non-doped polysilicon layer 23 which is a deposition layer of non-doped polysilicon is formed on the doped polysilicon layer 21 by CVD, as shown in FIG. 2D. The non-doped polysilicon 23, filling up the space 22 in the first trench 6, is formed also on portions of the doped polysilicon layer 21 located outside the first and second trenches 6 and 7.

Figure 2E:
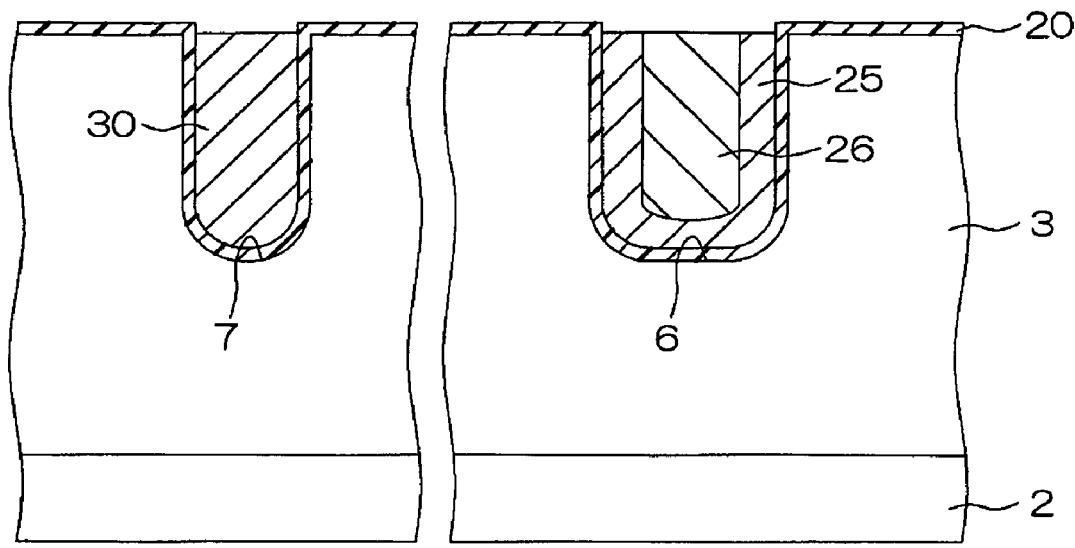
FIG. 2E is a schematic sectional view of a step subsequent to that of FIG. 2D.

Thereafter portions of the doped polysilicon layer 21 and those of the non-doped polysilicon layer 23 located outside the first and second trenches 6 and 7 are removed by etchback. The doped polysilicon layer 21 and the non-doped polysilicon layer 23 are etched back until the surfaces thereof are generally flush with the surface of the epitaxial layer 3, as shown in FIG. 2E. Thus, a thin-film doped polysilicon portion 25 formed on the inner surface of the gate insulating film 8 and a non-doped polysilicon portion 26 formed inside the doped polysilicon portion 25 are obtained in the first trench 6. Further, a doped polysilicon portion 30 is formed in the second trench 7.

The non-doped polysilicon layer 23 is so formed as to penetrate into the central portions of the first and second trenches 6 and 7, whereby the surfaces come into contact with each other on the penetrating portions. The non-doped polysilicon is doped with no impurity, and hence no impurity is present on the contact portions of the surfaces. Therefore, no recess is formed on a portion of the surface of the non-doped polysilicon layer 23 located above the relatively wide first trench 6. Thus, no recesses are formed on the surfaces of the doped polysilicon portions 25 and 30 and the non-doped polysilicon portion 26 after the etch-back step.

Figure 2F:
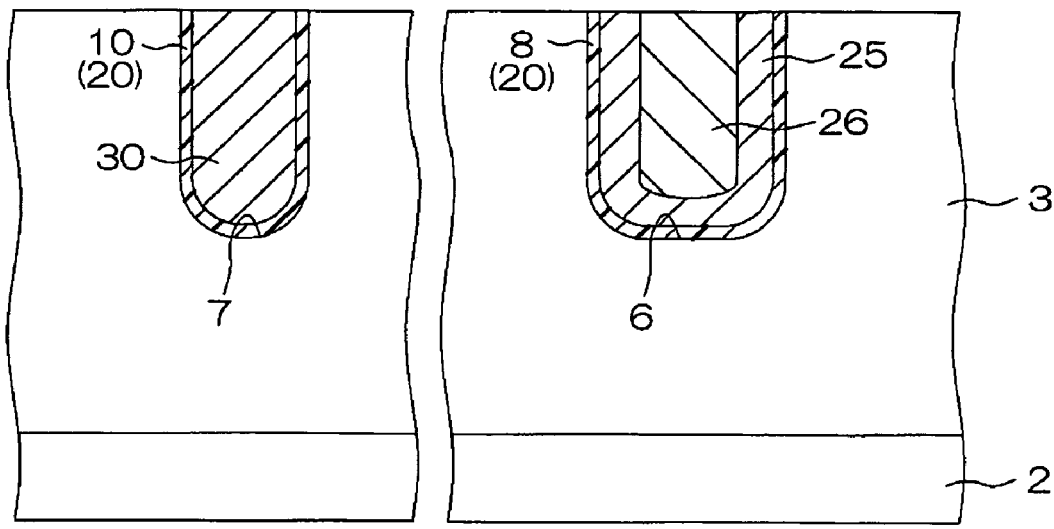
FIG. 2F is a schematic sectional view of a step subsequent to that of FIG. 2E.

Then, the oxide film 20 is removed from the surface of the epitaxial layer 3 by etching, as shown in FIG. 2F. Thus, the surface of the epitaxial layer 3 is exposed.

Then, a sacrificial oxide film is formed on the surfaces of the epitaxial layer 3, the doped polysilicon portions 25 and 30 and the non-doped polysilicon portion 26 by thermal oxidation. Thereafter the sacrificial oxide film formed on the surfaces of the epitaxial layer 3, the doped polysilicon portions 25 and 30 and the non-doped polysilicon portion 26 is removed by etching, thereby washing the surface of the epitaxial layer 3.

Figure 2G:
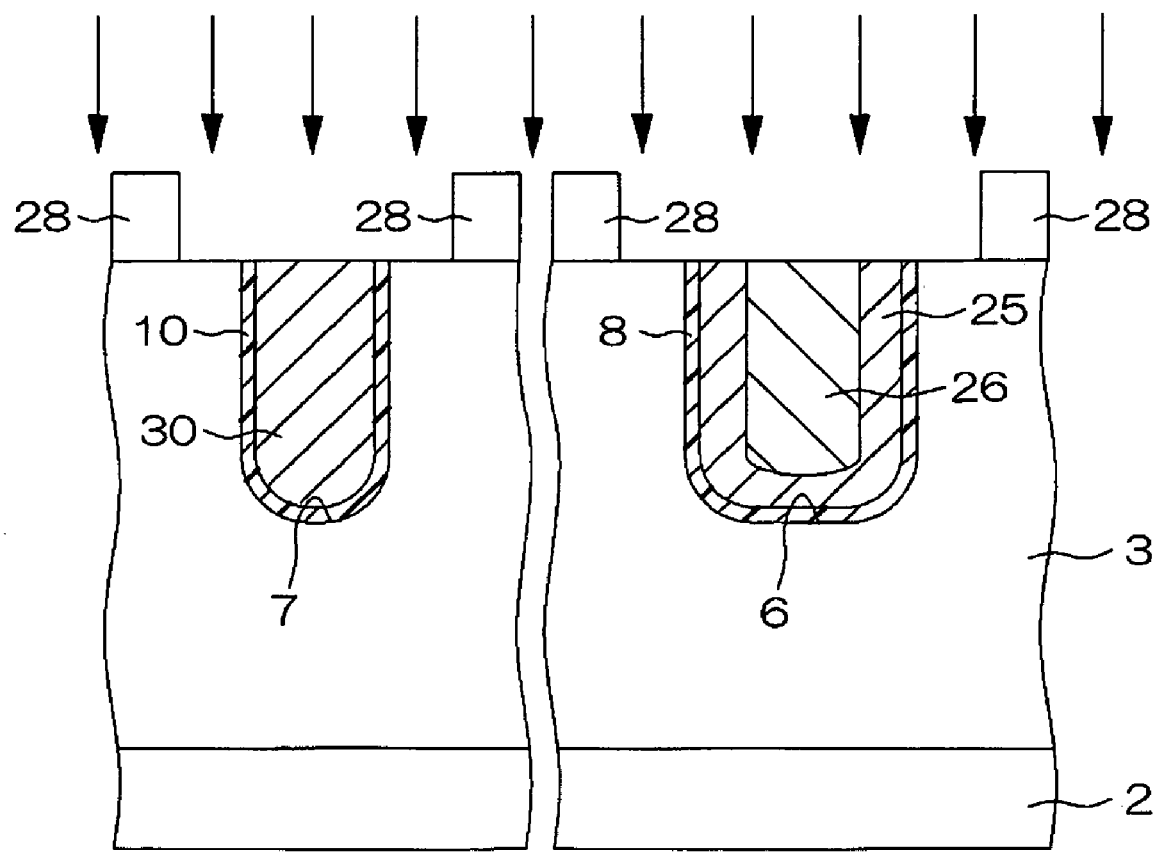
FIG. 2G is a schematic sectional view of a step subsequent to that of FIG. 2F.

Then, a mask 28 having a pattern for covering portions for forming the body contact regions 13 is formed on the epitaxial layer 3, as shown in FIG. 2G. Then, ions of an N-type impurity are implanted into a surface layer portion of the epitaxial layer 3, the doped polysilicon portions 25 and 30 and the non-doped polysilicon portion 26 through openings of the mask 28. After the ion implantation, the mask 28 is removed.

Figure 2H:
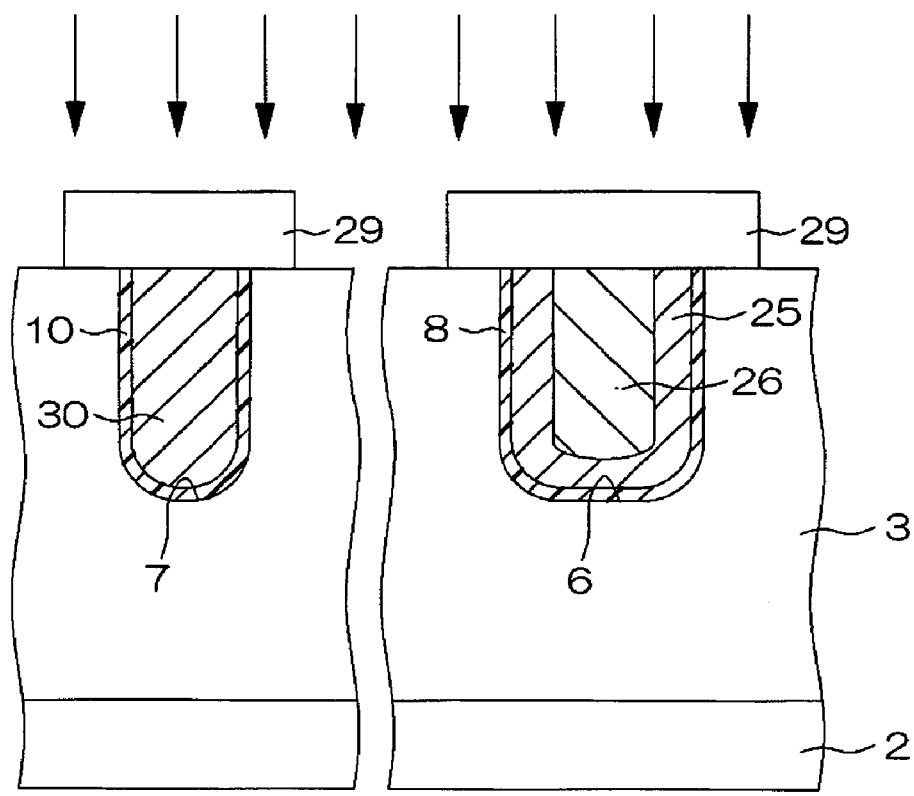
FIG. 2H is a schematic sectional view of a step subsequent to that of FIG. 2G.

Further, a mask 29 having openings in portions opposed to those for forming the body contact regions 13 is formed on the epitaxial layer 3, as shown in FIG. 2H. Then, ions of a P-type impurity are implanted into a surface layer portion of the epitaxial layer 3 through the openings of the mask 29. After this ion implantation, the mask 29 is removed.

Figure 2I:
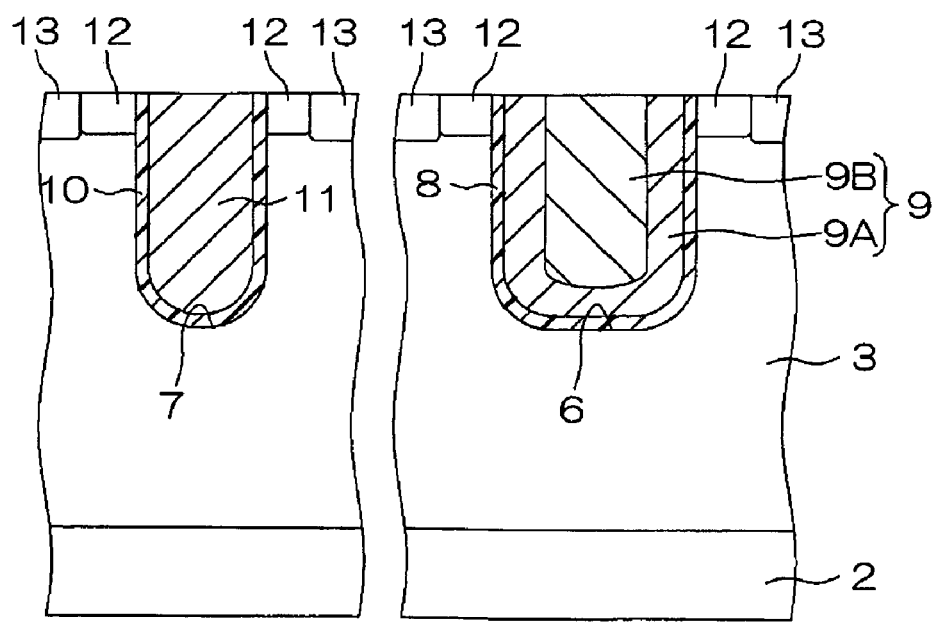
FIG. 2I is a schematic sectional view of a step subsequent to that of FIG. 2H.

Thereafter annealing is performed. The ions of the N- and P-type impurities implanted into a surface layer portion of the epitaxial layer 3 are activated by this annealing, so that the source regions 12 and the body contact regions 13 are formed on a surface layer portion of the epitaxial layer 3, as shown in FIG. 2I. Further, the ions of the N-type impurity implanted into the non-doped polysilicon portion 26 are activated, so that the non-doped polysilicon portion 26 is converted to a doped polysilicon portion and forms the low-concentration portion 9B, as shown in FIG. 2I. Thus, the first gate electrode 9 formed by the high-concentration portion 9A and the low-concentration portion 9B is obtained in the first trench 6. Further, the second gate electrode 11 formed by a high-concentration portion is obtained in the second trench 7.

After the aforementioned steps, the interlayer dielectric film 14 having a predetermined thickness is formed on the epitaxial layer 3 by CVD. The contact hole 16 and the like are formed in the interlayer dielectric film 14 by etching, and the gate wire 15, the source wire 17 and the drain electrode 18 are thereafter formed, to obtain the semiconductor device 1 shown in FIG. 1.

According to this embodiment, the first gate electrode 9 lined with the gate wire 15 through contact has a low resistance, and exhibits a high conductivity. Therefore, the first gate electrode 9 can exhibit a high conductivity on the overall region in the depth direction of the first trench 6.

Further, the second gate electrode 11 is formed by filling up the second trench 7 with the doped polysilicon layer 21 having a uniform impurity concentration, whereby the impurity concentration thereof is uniformized in the depth direction of the second trench 7.

Consequently, the resistances of the first and second gate electrodes 9 and 11 can be reduced.

In addition, the doped polysilicon layer 21 is formed with the thickness for leaving the space 22 in the first trench 6, the non-doped polysilicon layer 23 having the thickness for filling up the space 22 in the first trench 6 is formed on the doped polysilicon layer 21, and the doped polysilicon layer 21 and the non-doped polysilicon layer 23 are thereafter etched back.

The non-doped polysilicon layer 23 is so formed as to penetrate into the central portions of the first and second trenches 6 and 7, whereby the surfaces come into contact with each other on the penetrating portions. The non-doped polysilicon is doped with no impurity, and hence no impurity is present on the contact portions of the surfaces of the films. When the non-doped polysilicon layer 23 is etched back, therefore, no rate difference is caused between the respective portions thereof. Therefore, no recess is formed on a portion of the surface of the non-doped polysilicon layer 23 located above the relatively wide first trench 6. Thus, no recess is formed on the surface of the first gate electrode 9 after the etch-back step.

Consequently, the surface of the first gate electrode 9 can be prevented from formation of a large recess. Thus, the first gate electrode 9 can be prevented from formation of a crystal defect. Further, the surface of the first gate electrode 9 can be generally planarized, whereby a contact failure between the first gate electrode 9 and the gate wire 15 as well as a junction leak resulting from digging of the epitaxial layer 3 can be prevented.

Figure 3:
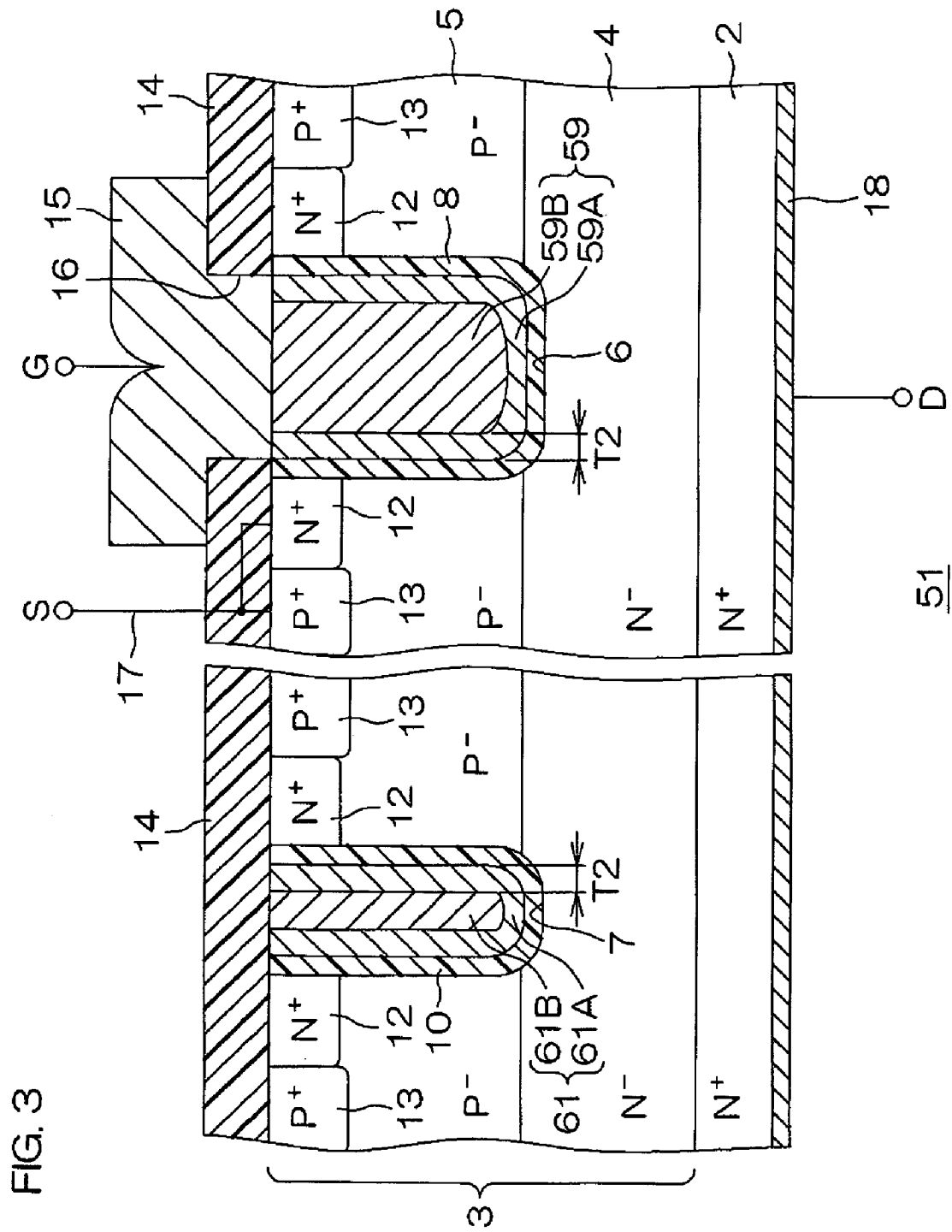
FIG. 3 is a sectional view schematically showing the structure of a semiconductor device according to a second embodiment of the present invention.

FIG. 3 is a schematic sectional view showing the structure of a semiconductor device according to a second embodiment of the present invention.

Referring to FIG. 3, portions corresponding to those shown in FIG. 1 are denoted by the same reference numerals. In the following, redundant description is omitted as to the portions denoted by the same reference numerals as those in FIG. 1.

In the semiconductor device 51 shown in FIG. 3, a first gate electrode 59 is employed in place of the first gate electrode 9 shown in FIG. 1. Further, a second gate electrode 61 is employed in place of the second gate electrode 11 shown in FIG. 1.

The first gate electrode 59 includes a high-concentration portion (high-conductivity portion) 59A made of doped polysilicon doped with an N-type impurity in a high concentration ($10^{20}/cm^3$, for example) and a low-concentration portion (low-conductivity portion) 59B made of doped polysilicon having a lower N-type impurity concentration ($10^{17}/cm^3$, for example) than the high-concentration portion 59A. The high-concentration portion 59A is in the form of a thin film formed on a gate insulating film 8, and the thickness T1 thereof is set to 0.1 μm, for example. The low-concentration portion 59B is formed on a region inside the high-concentration portion 59A.

The second gate electrode 61 includes a high-concentration portion (high-conductivity portion) 61A made of polysilicon doped with an N-type impurity in a high concentration ($10^{20}/cm^3$, for example) and a low-concentration portion (low-conductivity portion) 61B made of doped polysilicon having a lower N-type impurity concentration ($10^{17}/cm^3$, for example) than the high-concentration portion 61A. The high-concentration portion 61A is in the form of a thin film formed on the gate insulating film 10, and has the same thickness T1 as the high-concentration portion 59A of the first gate electrode 59. The low-concentration region 61B is formed on a region inside the high-concentration region 61A.

FIGS. 4A to 4I are schematic sectional views successively showing the steps of manufacturing the semiconductor device 51.

Figure 4A:
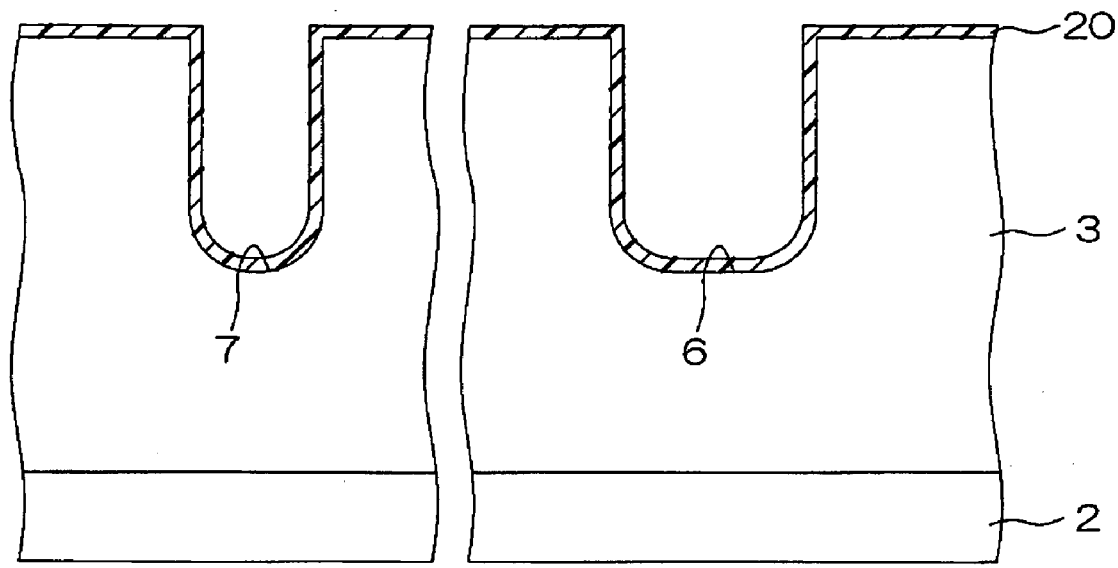
FIG. 4A is a schematic sectional view for describing a method of manufacturing the semiconductor device shown in FIG. 3.

First, a first trench 6 and a second trench 7 are formed in an epitaxial layer 3 provided on an N⁺-type substrate 2 by photolithography and etching. Thereafter an oxide film 20 made of $SiO_2$ is formed on the surface of the epitaxial layer 3 and the inner surfaces of the first and second trenches 6 and 7 by thermal oxidation, as shown in FIG. 4A.

Figure 4B:
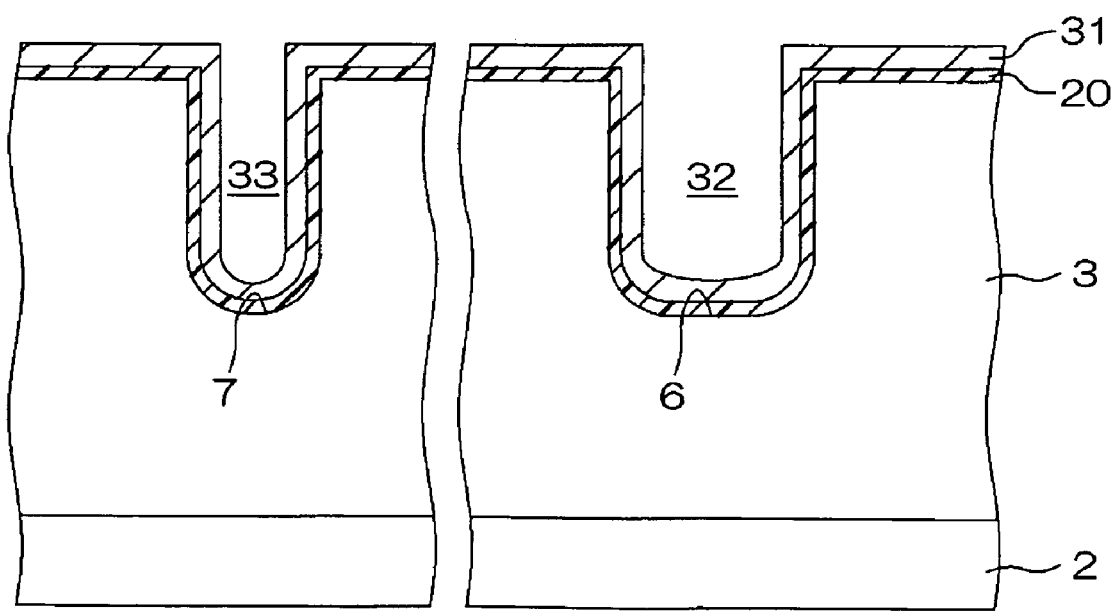
FIG. 4B is a schematic sectional view of a step subsequent to that of FIG. 4A.

Then, a first non-doped polysilicon layer 31 which is a deposition layer of non-doped polysilicon is formed on the oxide film 20 by CVD, as shown in FIG. 4B. The first non-doped polysilicon layer 31 does not fill up the first and second trenches 6 and 7, but leaves spaces 32 and 33 in the first and second trenches 6 and 7 respectively. The first non-doped polysilicon layer 31 is formed also on portions of the oxide film 20 located outside the first and second trenches 6 and 7.

Figure 4C:
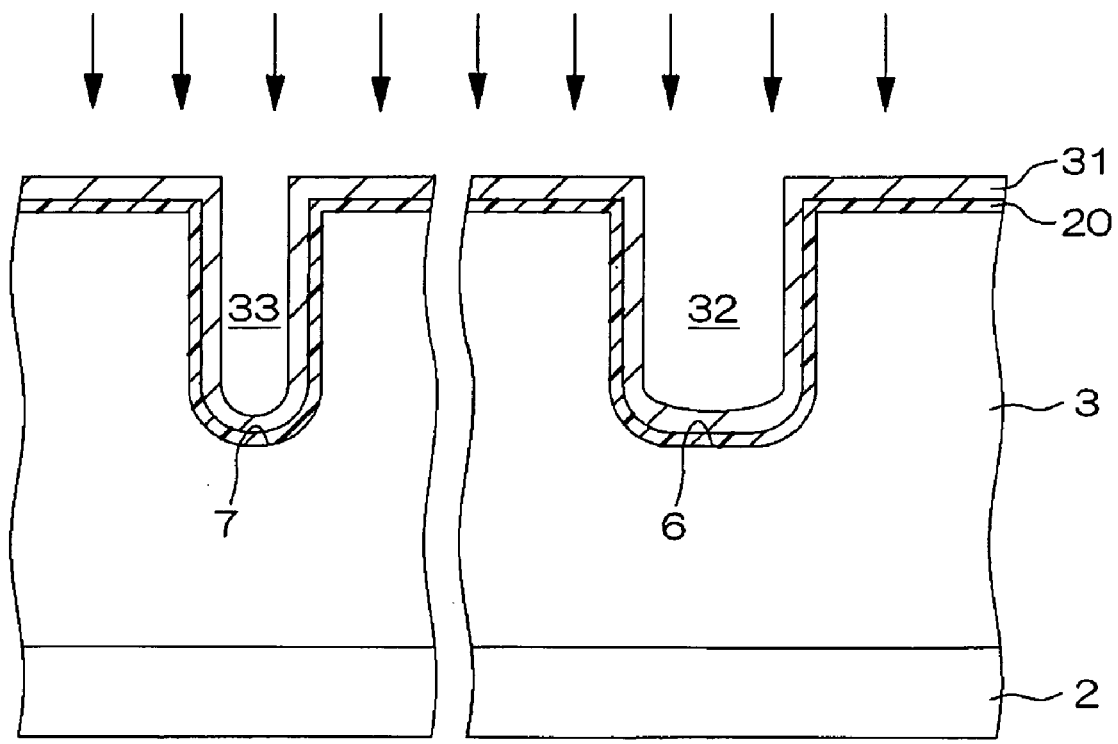
FIG. 4C is a schematic sectional view of a step subsequent to that of FIG. 4B.

Thereafter ions of an N-type impurity are implanted into the first non-doped polysilicon layer 31, as shown in FIG. 4C. Thereafter annealing is performed. The N-type impurity implanted into the first non-doped polysilicon layer 31 is diffused and the ions thereof are activated by this annealing. The ions of the N-type impurity are diffused in the overall region of the first non-doped polysilicon layer 31, so that the first non-doped polysilicon layer 31 is converted to a doped polysilicon layer 34. The doped polysilicon layer 34 has a uniform N-type impurity concentration, due to the small thickness of the first non-doped polysilicon layer 31.

Figure 4D:
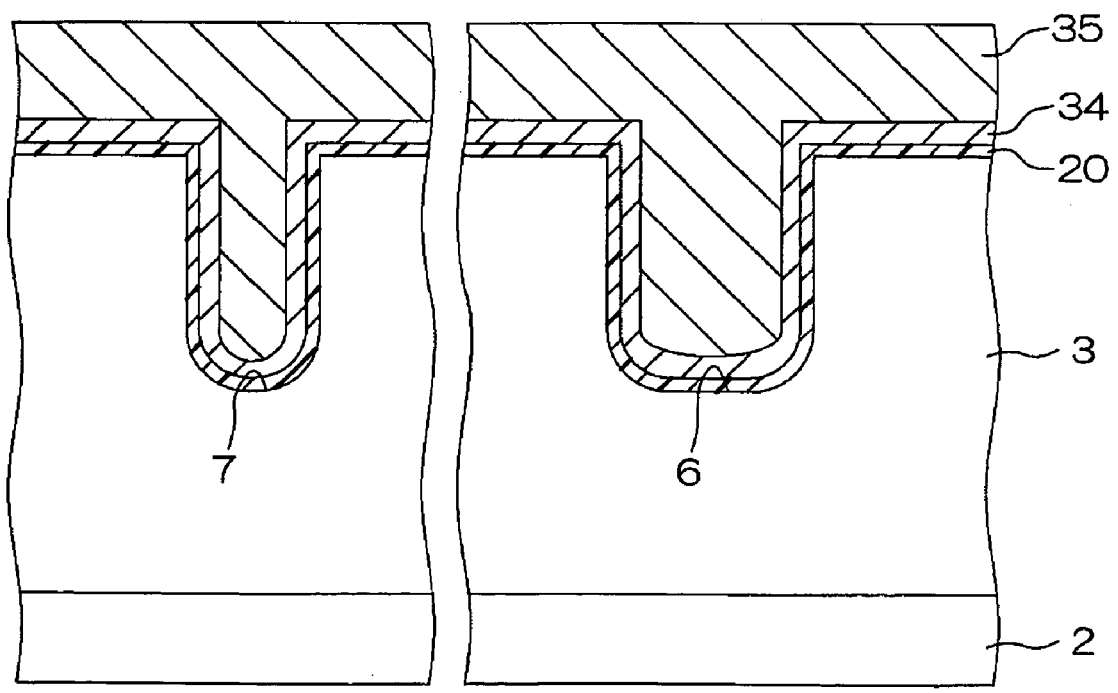
FIG. 4D is a schematic sectional view of a step subsequent to that of FIG. 4C.

Then, a second non-doped polysilicon layer 35 is formed on the doped polysilicon layer 34 by CVD, as shown in FIG. 4D. The second non-doped polysilicon layer 35 fills up the spaces 32 and 33 in the first and second trenches 6 and 7, and is formed also on portions of the doped polysilicon layer 34 located outside the first and second trenches 6 and 7.

Figure 4E:
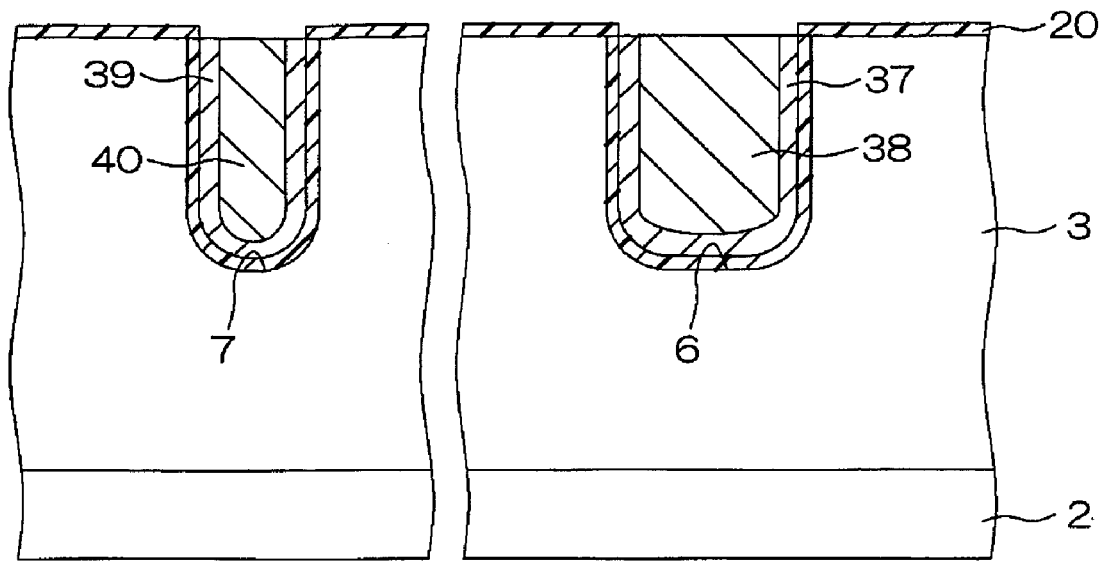
FIG. 4E is a schematic sectional view of a step subsequent to that of FIG. 4D.

Thereafter the portions of the doped polysilicon layer 34 and the second non-doped polysilicon layer 35 located outside the first and second trenches 6 and 7 are removed by etch-back. The doped polysilicon layer 34 and the second non-doped polysilicon layer 35 are etched back until the surfaces thereof are generally flush with the surface of the epitaxial layer 3, as shown in FIG. 4E. Thus, a thin-film doped polysilicon portion 37 formed on the inner surface of the gate insulating film 8 and a non-doped polysilicon portion 38 formed inside the doped polysilicon portion 37 are obtained in the first trench 6. Further, a thin-film doped polysilicon portion 39 formed on the inner surface of a gate insulating film 10 and a non-doped polysilicon portion 40 formed inside the doped polysilicon portion 39 are obtained in the second trench 7.

The second non-doped polysilicon layer 35 is so formed as to penetrate into the central portions of the first and second trenches 6 and 7, whereby the surfaces come into contact with one another on the penetrating portions. The non-doped polysilicon is doped with no impurity, and hence no impurity is present on the contact portions of the surfaces. When the second non-doped polysilicon layer 35 is etched back, therefore, no rate difference is caused between the respective portions thereof. Thus, no recess is formed on a portion of the surface of the second non-doped polysilicon layer 35 located above the relatively wide first trench 6. Therefore, no recesses are formed on the surfaces of the doped polysilicon portions 37 and 39 and the non-doped polysilicon portions 38 and 40 after the etch-back step.

Figure 4F:
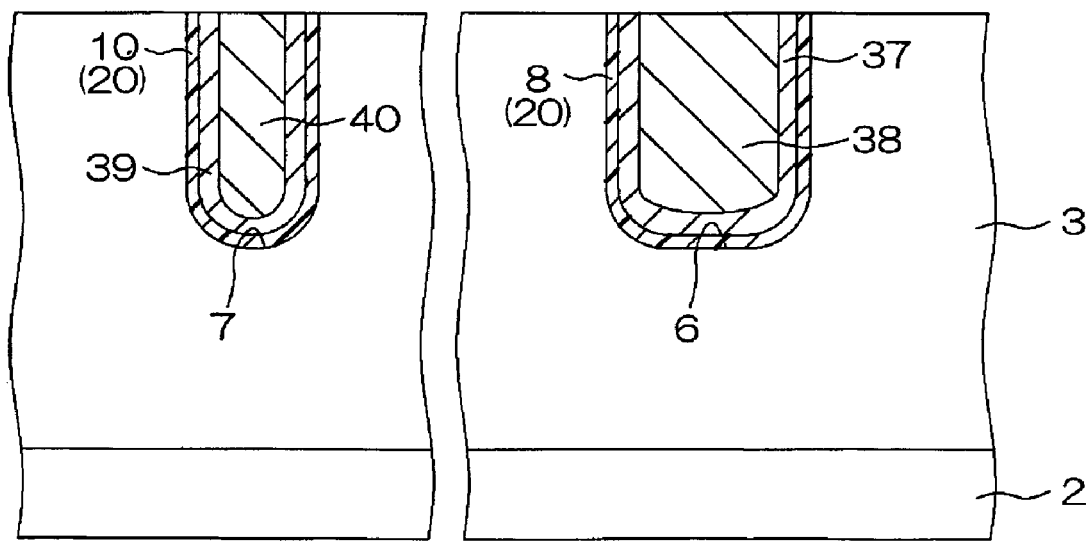
FIG. 4F is a schematic sectional view of a step subsequent to that of FIG. 4E.

Then, the oxide film 20 is removed from the surface of the epitaxial layer 3 by etching, as shown in FIG. 4F. Thus, the surface of the epitaxial layer 3 is exposed.

Then, a sacrificial oxide film is formed on the surfaces of the epitaxial layer 3, the doped polysilicon portions 37 and 39 and the non-doped polysilicon portions 38 and 40 by thermal oxidation. Thereafter the sacrificial oxide film formed on the surfaces of the epitaxial layer 3, the doped polysilicon portions 37 and 39 and the non-doped polysilicon portions 38 and 40 is removed by etching, thereby washing the surface of the epitaxial layer 3.

Figure 4G:
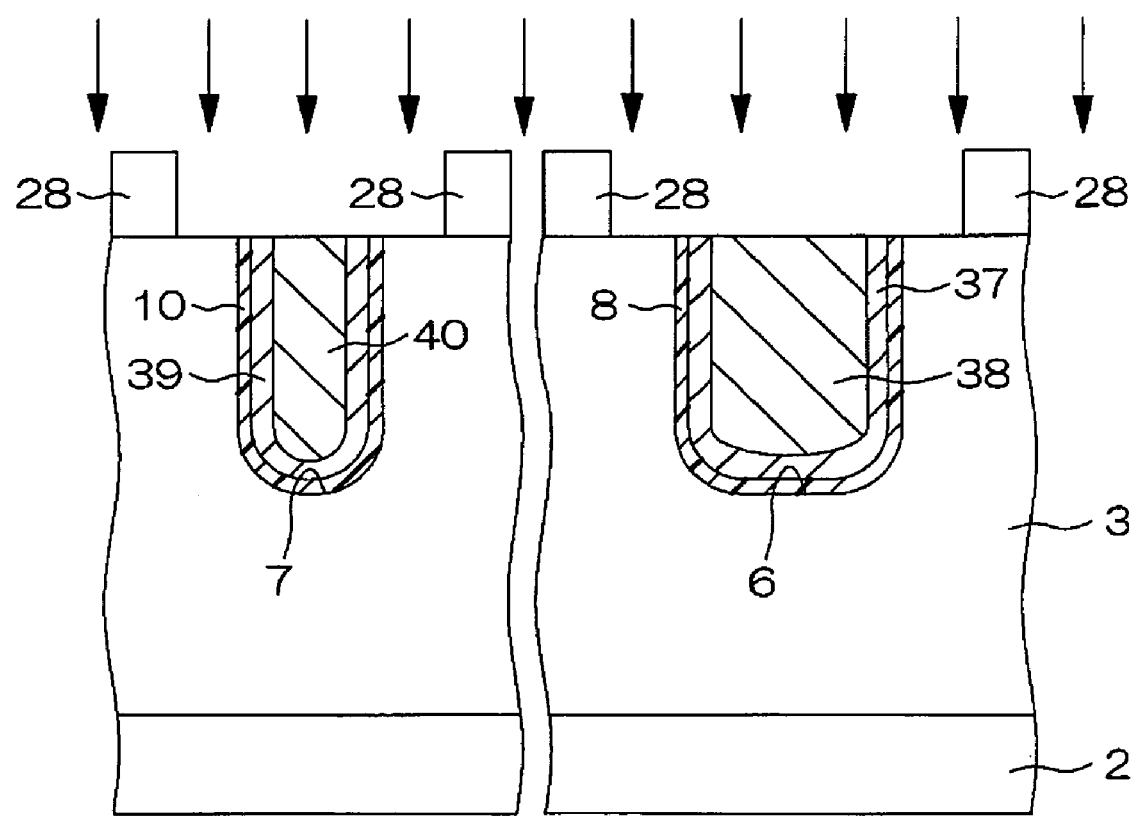
FIG. 4G is a schematic sectional view of a step subsequent, to that of FIG. 4F.

Then, a mask 28 having a pattern for covering portions for forming body contact regions 13 is formed on the epitaxial layer 3, as shown in FIG. 4G. Then, ions of an N-type impurity are implanted into a surface layer portion of the epitaxial layer 3, the portions 37 and 38 in the first trench 6 and the portions 39 and 40 in the second trench 7 through openings of the mask 28. After the ion implantation, the mask 28 is removed.

Figure 4H:
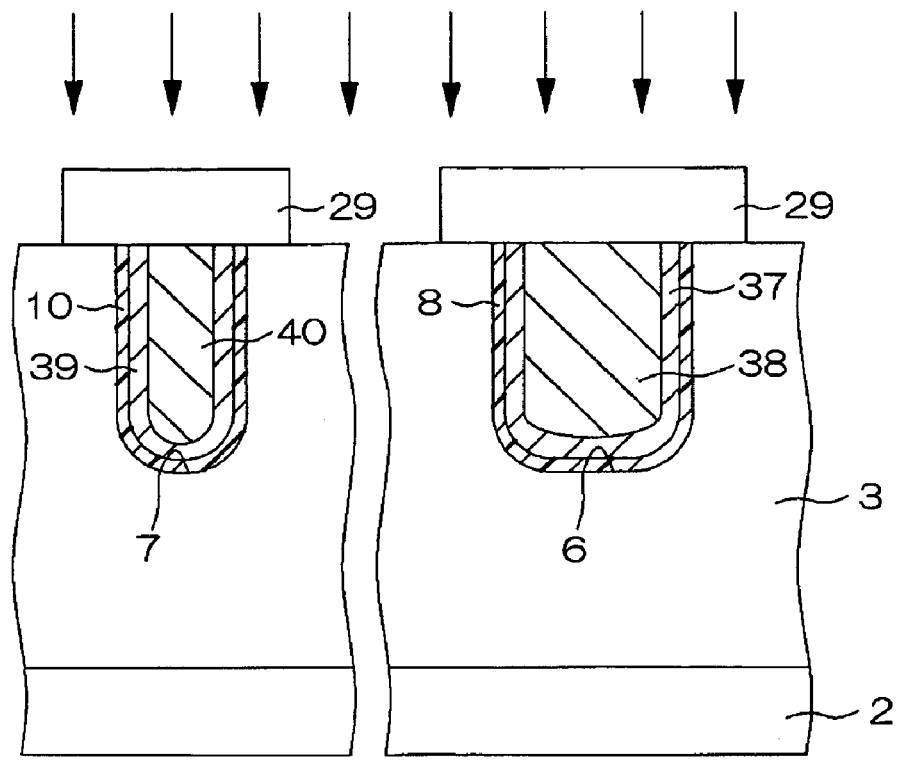
FIG. 4H is a schematic sectional view of a step subsequent to that of FIG. 4G.

Further, a mask 29 having openings in portions opposed to those for forming the body contact regions 13 is formed on the epitaxial layer 3, as shown in FIG. 4H. Then, ions of a P-type impurity are implanted into a surface layer portion of the epitaxial layer 3 through the openings of the mask 29. After this ion implantation, the mask 29 is removed.

Figure 4I:
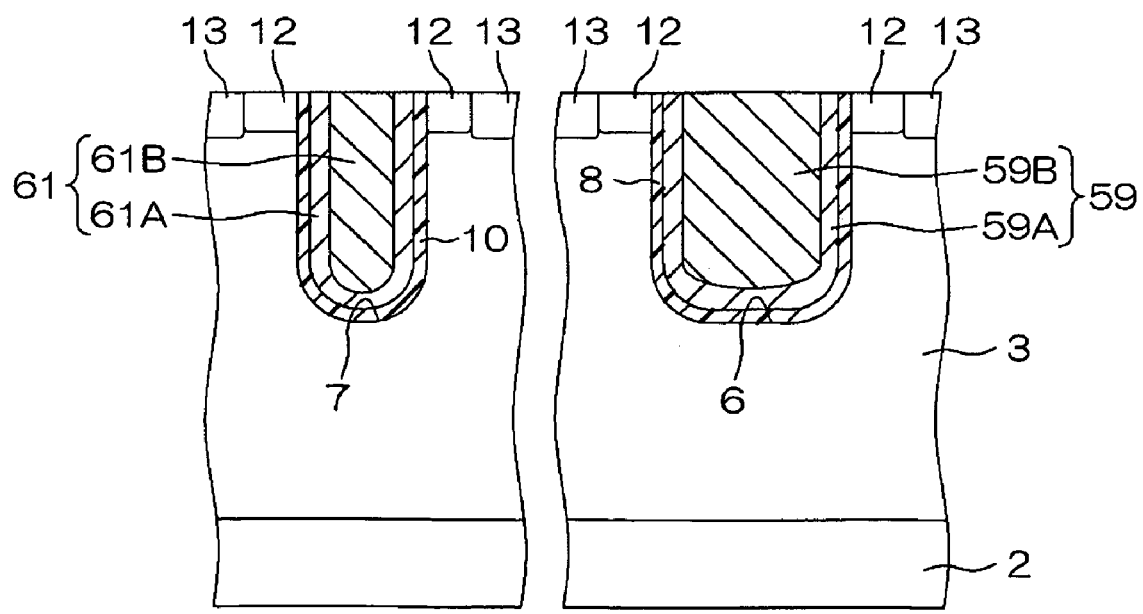
FIG. 4I is a schematic sectional view of a step subsequent to that of FIG. 4H.

Thereafter annealing is performed. The ions of the N- and P-type impurities implanted into a surface layer portion of the epitaxial layer 3 are activated by this annealing, so that source regions 12 and the body contact regions 13 are formed on a surface layer portion of the epitaxial layer 3, as shown in FIG. 4I. Further, the ions of the N-type impurity implanted into the non-doped polysilicon portions 38 and 40 of the first and second trenches 6 and 7 are activated, so that the non-doped polysilicon portions 38 and 40 form the low-concentration portions 59B and 61B respectively, as shown in FIG. 4I. Thus, the first gate electrode 59 formed by the high- and low-concentration portions 59A and 59B is obtained in the first trench 6. Further, the second gate electrode 61 formed by the high- and low-concentration portions 61A and 61B is obtained in the second trench 7.

After the aforementioned steps, an interlayer dielectric film 14 having a predetermined thickness is formed on the epitaxial layer 3 by CVD. Then, a contact hole 16 and the like are formed in the interlayer dielectric film 14 by etching, and a gate wire 15, a source wire 17 and a drain electrode 18 are thereafter formed, to obtain the semiconductor device 51 shown in FIG. 3.

In this semiconductor device 51, the first gate electrode 59 has the high-concentration portion 59A covering the gate insulating film 8. Therefore, the first gate electrode 59 can exhibit a high conductivity on the overall region in the depth direction of the first trench 6. The second gate electrode 61 can also exhibit a high conductivity on the overall region in the depth direction of the second trench 7.

Consequently, the resistances of the first and second gate electrodes 59 and 61 can be reduced.

The inner portions of the gate electrodes 9, 59 and 61, formed by the low-concentration portions 9B, 59B and 61B made of the polysilicon doped with the N-type impurities in high concentrations, may alternatively be made of non-doped polysilicon containing no impurities. These structures are implemented by covering the surfaces of the non-doped polysilicon portions 26, 38 and 40 with the masks 28 in advance of the steps of implanting the N-type impurities.

In the semiconductor devices 1 and 51, the aforementioned conductivity types (P- and N-types) of semiconductor portions may be inverted.

Figure 5:
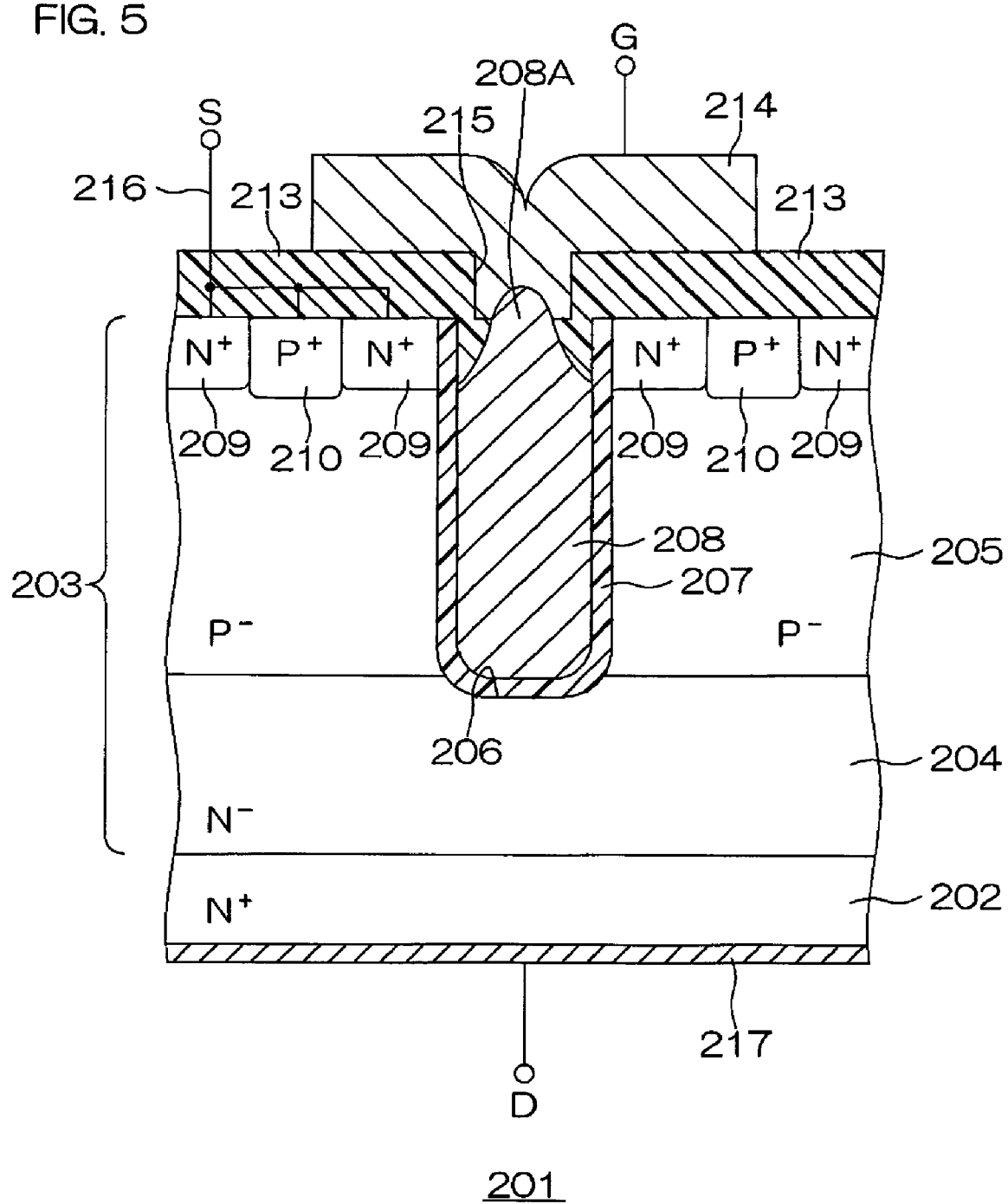
FIG. 5 is a sectional view schematically showing the structure of a semiconductor device according to a third embodiment of the present invention.

FIG. 5 is a sectional view showing the structure of a semiconductor device according to a third embodiment of the present invention.

The semiconductor device 201 has an array structure formed by arranging unit cells having trench gate type VDMOSFET in the form of a matrix.

On an N$^+$-type semiconductor substrate 202 forming the base of the semiconductor device 201, an N$^-$-type epitaxial layer 203 as a semiconductor layer made of silicon doped with an N-type impurity in a lower concentration ($10^{16}$/cm$^3$, for example) than the N$^+$-type semiconductor substrate 202 is laminated. A base layer portion of the epitaxial layer 203 keeps the state after epitaxy, and forms an N$^-$-type region 204. In the epitaxial layer 203, a P$^-$-type body region 205 is formed on the N$^-$-type region 204 in contact with the N$^-$-type region 204.

A trench 206 is dug in the epitaxial layer 203 from the surface thereof. The trench 206 penetrates through the body region 205, so that the deepest portion thereof reaches the N$^-$-type region 204. A plurality of such trenches 206 are formed at regular intervals in the horizontal direction in FIG. 5, to extend in a direction (along the gate width) orthogonal to the plane of FIG. 5 respectively.

A gate insulating film 207 made of SiO$_2$ (silicon oxide) is formed in the trench 206, to cover the overall inner surface thereof. A gate electrode 208 made of silicon (doped silicon) doped with an N-type impurity in a high concentration ($10^{20}$/cm$^3$, for example) is embedded in the trench 206 inside the gate insulating film 207. The N-type impurity contained in the gate electrode 208 can be prepared from P (phosphorus) or As (arsenic), for example.

An upward protrusion 208A is formed on the surface of the gate electrode 208. The protrusion 208A protrudes upward from the inner portion of the trench 206, with the forward end located on the central portion of the trench 206 in the direction (horizontal direction in FIG. 5) orthogonal to the gate width. The forward end of the protrusion 208A reaches a portion outside the trench 206.

On a surface layer portion of the epitaxial layer 203, N$^+$-type source regions 209 each having a higher N-type impurity concentration ($10^{20}$/cm$^3$, for example) than the N$^-$-type region 204 are formed on both sides in the direction orthogonal to the gate width with respect to the trench 206. The source regions 209 extend in the direction along the gate width along the trench 206, so that the bottom portions thereof are in contact with the body region 205. P$^+$-type body contact regions 210 are formed in the central portions of the source regions 209 in the direction orthogonal to the gate width, to penetrate through the source regions 209.

That is, the trenches 206 and the source regions 209 are alternately provided in the direction orthogonal to the gate width, to extend in the direction along the gate width respectively. The boundary between each pair of unit cells adjacent to each other in the direction orthogonal to the gate width is set on each source region 209 along the source region 209. At least not less than one body contact region 210 is provided over each pair of unit cells adjacent to each other in the direction orthogonal to the gate width. The boundary between each pair of unit cells adjacent to each other in the direction along the gate width is so set that the gate electrode 208 included in each unit cell has a constant gate width.

An interlayer dielectric film 213 is laminated on the epitaxial layer 203. A gate wire 214 made of Al, for example, is formed on the interlayer dielectric film 213. In the interlayer dielectric film 213, a gate contact hole 215 is formed on a region opposed to the protrusion 208A of the gate electrode 208. The gate contact hole 215 has such a depth that the lower end thereof is generally flush with the surface of the epitaxial layer 203. The gate wire 214 enters this gate contact hole 215, to be connected with the protrusion 208A in the gate contact hole 215. Thus, contact between the gate electrode 208 and the gate wire 214 is attained.

In the interlayer dielectric film 213, source contact holes (not shown) are formed on regions opposed to the source regions 209 and the body contact regions 210. The source contact holes penetrate through the interlayer dielectric film 213, so that the lower ends thereof reach the surface of the epitaxial layer 203. A source wire 216 is in contact with the corresponding source regions 209 and the corresponding body contact region 210 through the corresponding source contact hole (not shown). The source wire 216 is grounded.

A drain electrode 217 is formed on the back surface of the N$^+$-type semiconductor substrate 202.

A current can be fed between the source regions 209 and the drain electrode 217 by controlling the potential of the gate electrode 208 while applying a positive voltage of a proper level to the drain electrode 217 thereby forming a channel in a portion of the body region 205 in the vicinity of the interface between the same and the gate insulating film 207.

FIGS. 6A to 6M are schematic sectional views successively showing the steps of manufacturing the semiconductor device 201.

Figure 6A:
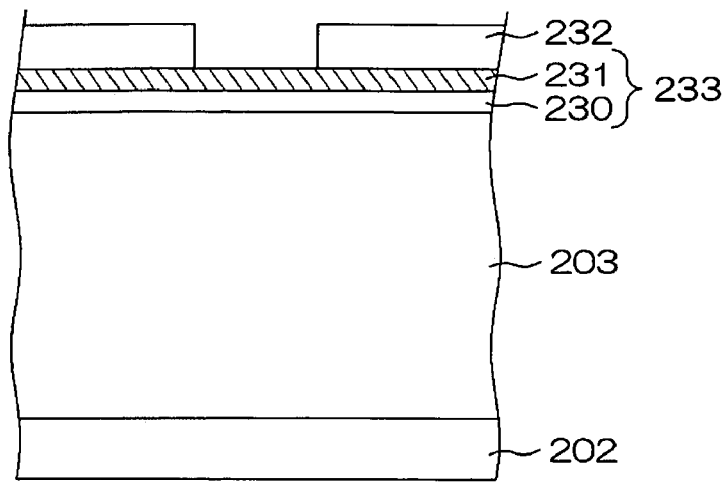
FIG. 6A is a schematic sectional view for describing a method of manufacturing the semiconductor device shown in FIG. 5.

First, the epitaxial layer 203 is formed on the N$^+$-type semiconductor substrate 202 by epitaxy. Then, an SiO$_2$ layer 230 and an SiN (silicon nitride) layer 231 are formed on the surface of the epitaxial layer 203 in this order, as shown in FIG. 6A. Thereafter a resist pattern 232 is formed on the SiN layer 231.

Figure 6B:
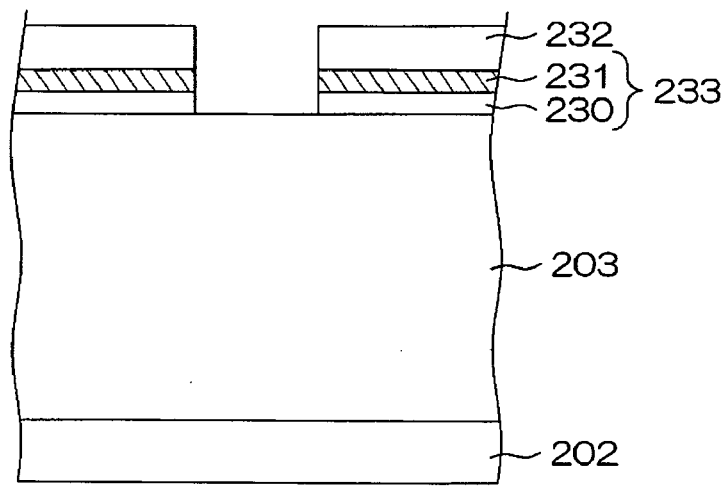
FIG. 6B is a schematic sectional view of a step subsequent to that of FIG. 6A.

The SiO$_2$ layer 230 and the SiN (silicon nitride) layer 231 are selectively removed by etching through the resist pattern 232 serving as a mask. Thus, a hard mask 233 consisting of the SiN layer 231 and the SiO$_2$ layer 230 is formed as shown in FIG. 6B.

Figure 6C:
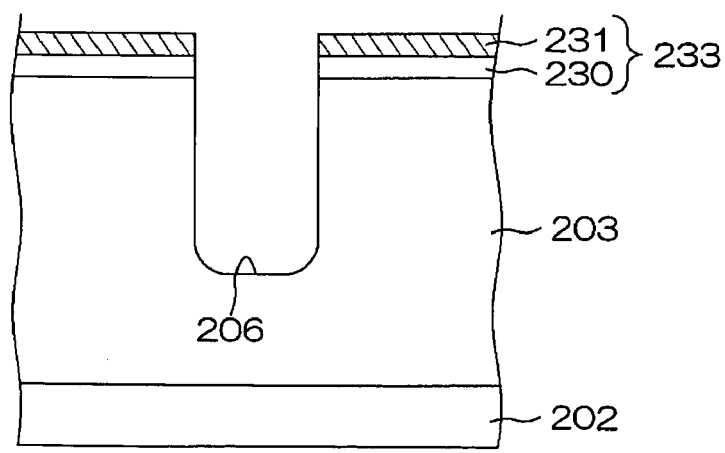
FIG. 6C is a schematic sectional view of a step subsequent to that of FIG. 6B.

Then, the resist pattern 232 is removed, and the trench 206 is thereafter formed by etching the epitaxial layer 203 through the hard mask 233, as shown in FIG. 6C.

Figure 6D:
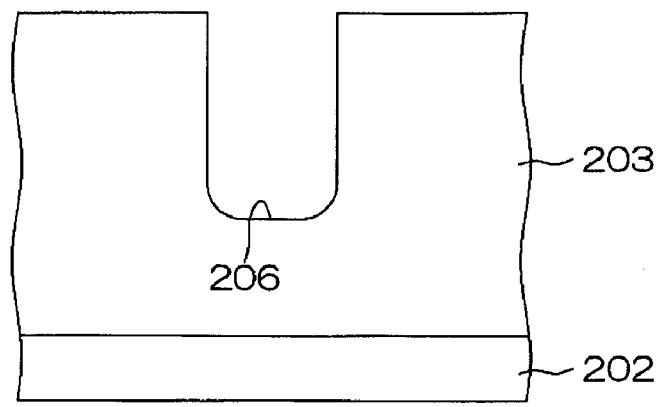
FIG. 6D is a schematic sectional view of a step subsequent to that of FIG. 6C.

Thereafter the hard mask 233 is removed, as shown in FIG. 6D.

Figure 6E:
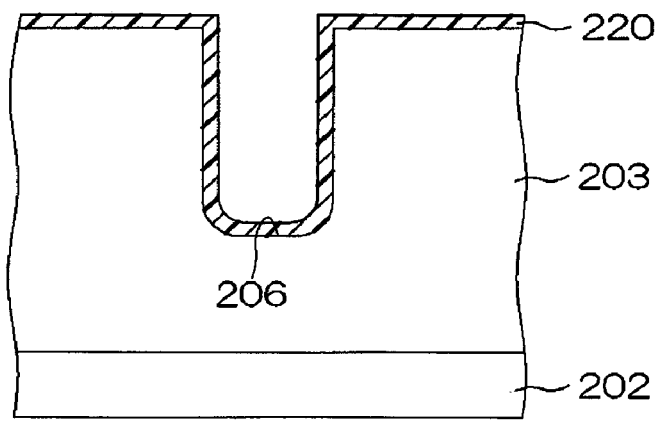
FIG. 6E is a schematic sectional view of a step subsequent to that of FIG. 6D.

Then, an oxide film 220 made of SiO$_2$ is formed on the surface of the epitaxial layer 203 and the inner surface of the trench 206 by thermal oxidation, as shown in FIG. 6E.

Figure 6F:
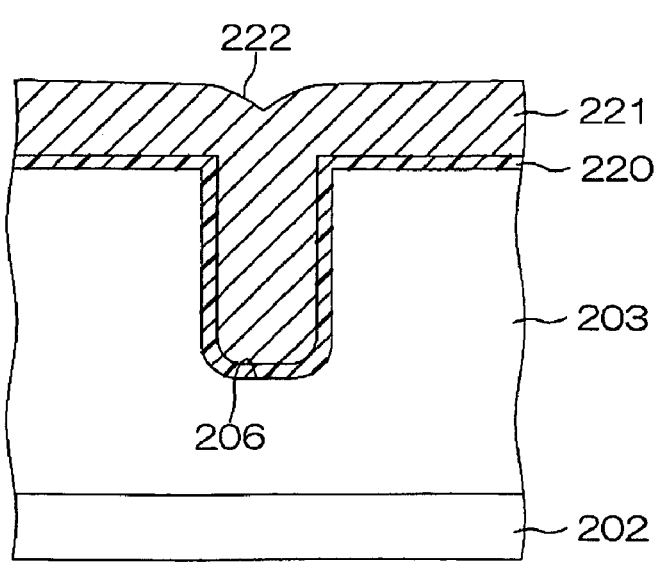
FIG. 6F is a schematic sectional view of a step subsequent to that of FIG. 6E.

Then, a doped silicon layer 221 which is a deposition layer of doped silicon is formed on the oxide film 220 by CVD. The doped silicon layer 221 fills up the trench 206, and is formed also on portions of the oxide film 220 located outside the trench 206, as shown in FIG. 6F. The doped silicon layer 221 grows from the surface of the epitaxial layer 203 including the side surface of the trench 206 at the same rate on the overall surface, whereby a recess 222 is formed in the surface of the doped silicon layer 221 on a position opposed to the trench 206. This recess 222 has a V-shaped sectional shape in the direction (horizontal direction in FIG. 6F) of the trench 206 orthogonal to the gate width.

Figure 6G:
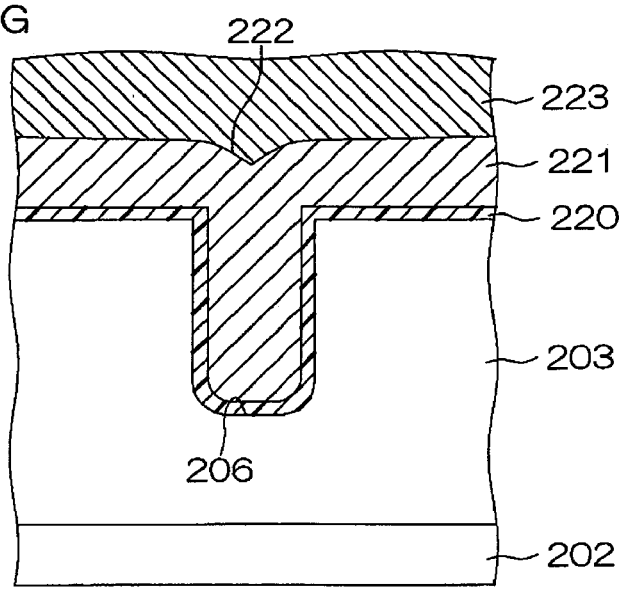
FIG. 6G is a schematic sectional view of a step subsequent to that of FIG. 6F.

Then, an etching suppression layer 223 which is a deposition layer of an organic BARC (Bottom Anti-Reflection Coating) is formed on the doped silicon layer 221 by spin coating, as shown in FIG. 6G. This organic material is etched back at a lower rate than the doped silicon. The etching suppression layer 223 fills up the recess 222.

Figure 6H:
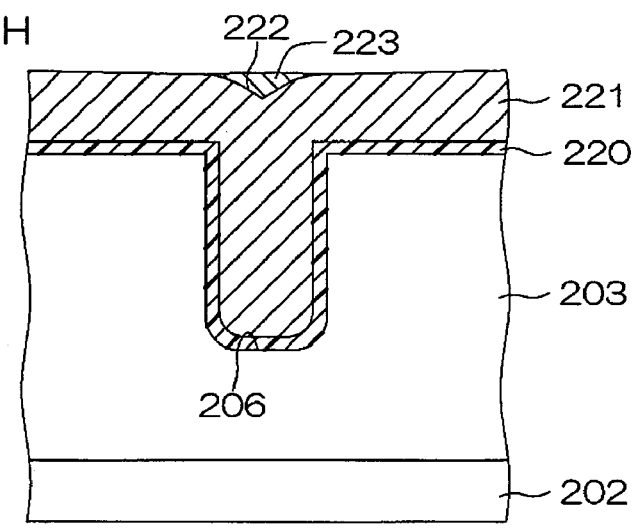
FIG. 6H is a schematic sectional view of a step subsequent to that of FIG. 6G.

Thereafter the etching suppression layer 223 is removed by etch-back, until the surface of the doped silicon layer 221 is exposed. Thus, the etching suppression layer 223 formed on the doped silicon layer 221 is partially left in the recess 222, while the remaining portions thereof are removed, as shown in FIG. 6H. The etching suppression layer 223 left in the recess 222 has the largest thickness in a portion located above the central portion of the trench 206 in the direction of the trench 206 orthogonal to the gate width.

Figure 6I:
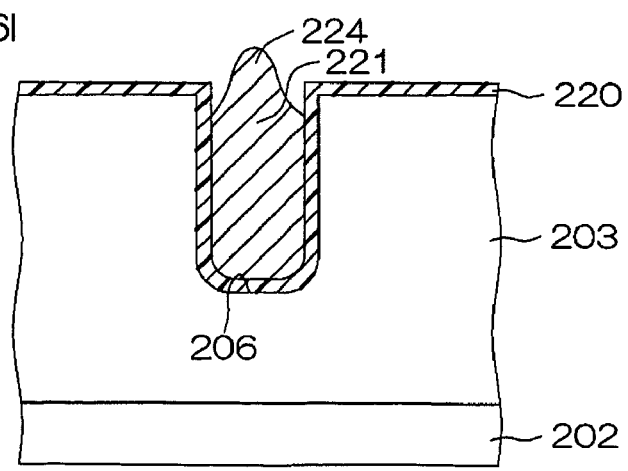
FIG. 6I is a schematic sectional view of a step subsequent to that of FIG. 6H.

Thereafter the etch-back is so continued as to remove the doped silicon layer 221 and the etching suppression layer 223. The etching suppression layer 223 is etched back at a lower rate than he doped silicon layer 221, and hence the region having the etching suppression layer 223 embedded therein causes smaller film loss than the region having no etching suppression layer 223 provided thereon. Further, the region of the etching suppression layer 223 having a larger thickness causes smaller film loss than the region having a smaller thickness. Therefore, an upward protrusion 224 is formed on the surface of the doped silicon layer 221 after the etch-back step, as shown in FIG. 6I. At this time, the forward end of the protrusion 224 reaches a portion outside the trench 206.

Figure 6J:
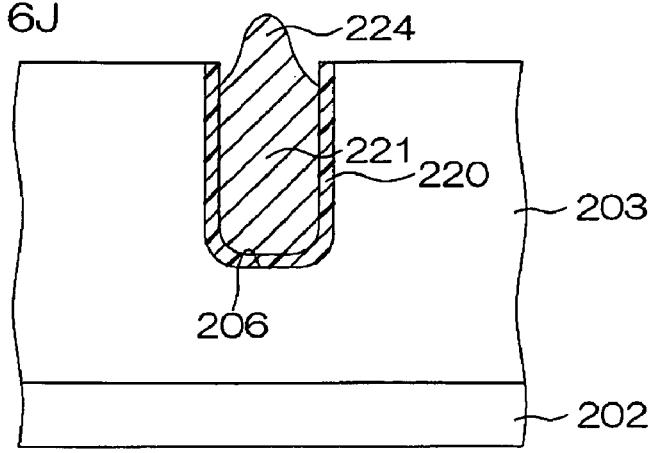
FIG. 6J is a schematic sectional view of a step subsequent to that of FIG. 6I.

Thereafter the oxide film 220 is removed from the surface of the epitaxial layer 203 by wet etching, as shown in FIG. 6J. Thus, the surface of the epitaxial layer 203 is exposed, and the oxide film 220 left in the trench 206 forms the gate insulating film 207.

Then, an oxide film (not shown) is formed on the surfaces of the epitaxial layer 203 and the doped silicon layer 221 by thermal oxidation.

Figure 6K:
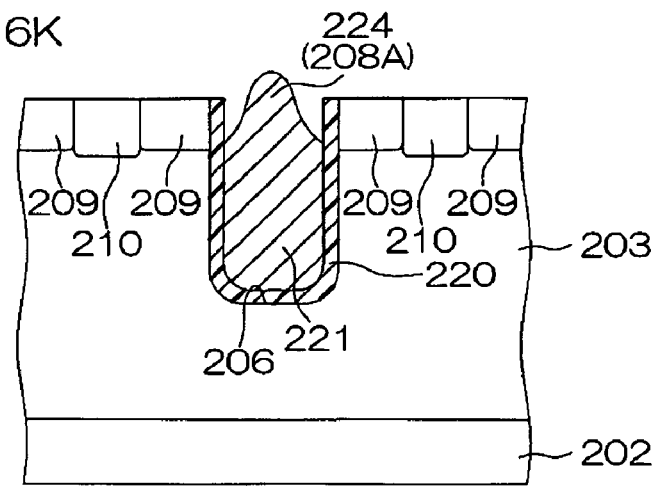
FIG. 6K is a schematic sectional view of a step subsequent to that of FIG. 6J.

Thereafter ions of an N-type impurity are implanted into portions of a surface layer portion of the epitaxial layer 203 for forming the body contact regions 210. Then, ions of a P-type impurity are implanted into portions of a surface layer portion of the epitaxial layer 203 opposed to those for forming the body contact regions 210. Thus, the source regions 209 and the body contact regions 210 are formed on a surface layer portion of the epitaxial layer 203, as shown in FIG. 6K.

Figure 6L:
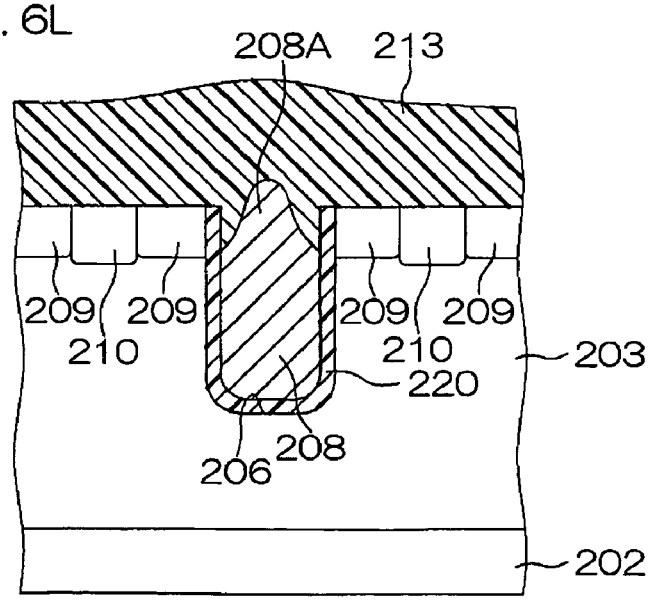
FIG. 6L is a schematic sectional view of a step subsequent to that of FIG. 6K.

After the aforementioned steps, the oxide film is removed from the surfaces of the epitaxial layer 203 and the doped silicon layer 221. Then, the interlayer dielectric film 213 having a predetermined thickness is formed on the epitaxial layer 203 by CVD, as shown in FIG. 6L.

Figure 6M:
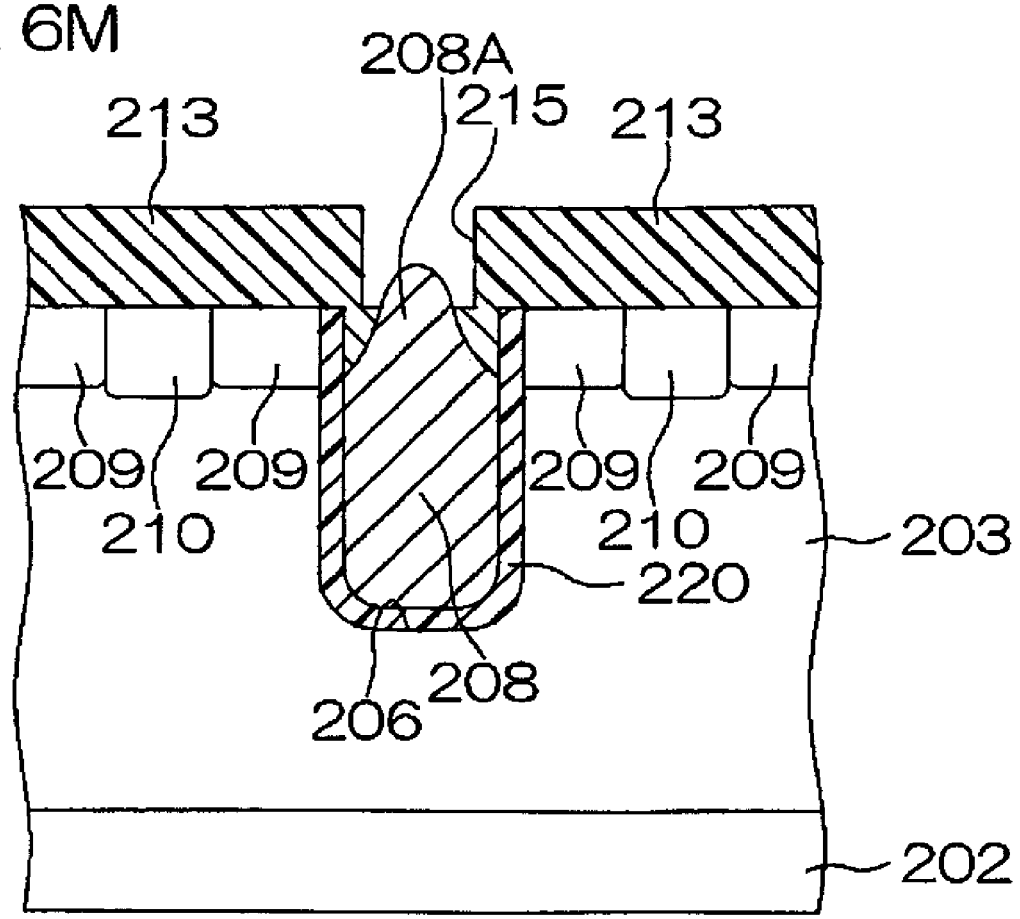
FIG. 6M is a schematic sectional view of a step subsequent to that of FIG. 6L.

Then, the gate contact hole 215 and the source contact holes (not shown) are formed in the interlayer dielectric film 213 by etching as shown in FIG. 6M, and the gate wire 214, the source wire 216 and the drain electrode 217 are thereafter formed, to obtain the semiconductor device 201 shown in FIG. 5.

In the semiconductor device 201, the protrusion 208A is formed on the surface of the gate electrode 208. Even if a portion of the surface of the gate electrode 208 around the protrusion 208A is lower than the surface of the epitaxial layer 203, therefore, the gate contact hole 215 formed in the interlayer dielectric film 213 laminated on the epitaxial layer 203 can reliably reach the gate electrode 208 when the etching time (quantity) for forming the gate contact hole 215 is set with reference to the forward end of the protrusion 208A.

If the contact holes for attaining contact with the epitaxial layer 203 (source regions 209) are formed by etching in the same step along with the gate contact hole 215 as hereinabove described, the etching time is set with reference to the surface of the epitaxial layer 203, so that the gate contact hole 215 can reach the gate electrode 208 while the epitaxial layer 203 can be prevented from remarkable digging.

Therefore, excellent contact with the gate electrode 208 can be attained without causing a junction leak.

Further, the protrusion 208A protrudes upward from the inner portion of the trench 206 and the forward end thereof reaches a portion outside the trench 206, whereby the gate contact hole 215 can reliably reach the protrusion 208A of the gate electrode 208 without digging the epitaxial layer 203 when the etching time (quantity) for forming the gate contact hole 215 is set with reference to the surface of the epitaxial layer 203.

The etching suppression layer 223, made of the organic material employed as the material for the BARC in this embodiment, may alternatively be made of another material such as $SiO_2$, SiN (silicon nitride) or resist, for example, etched back at a lower rate than silicon and capable of obtaining a film having a planar surface. For example, a deposition layer of $SiO_2$ can be formed by spin coating or CVD. On the other hand, a deposition layer of SiN can be formed by CVD, while a deposition layer of resist can be formed by spin coating.

In addition, the conductivity types of semiconductor portions of the semiconductor device 201 may be inverted. That is, P-type portions may be converted to N-type portions and vice versa in the semiconductor device 201.

Figure 7:
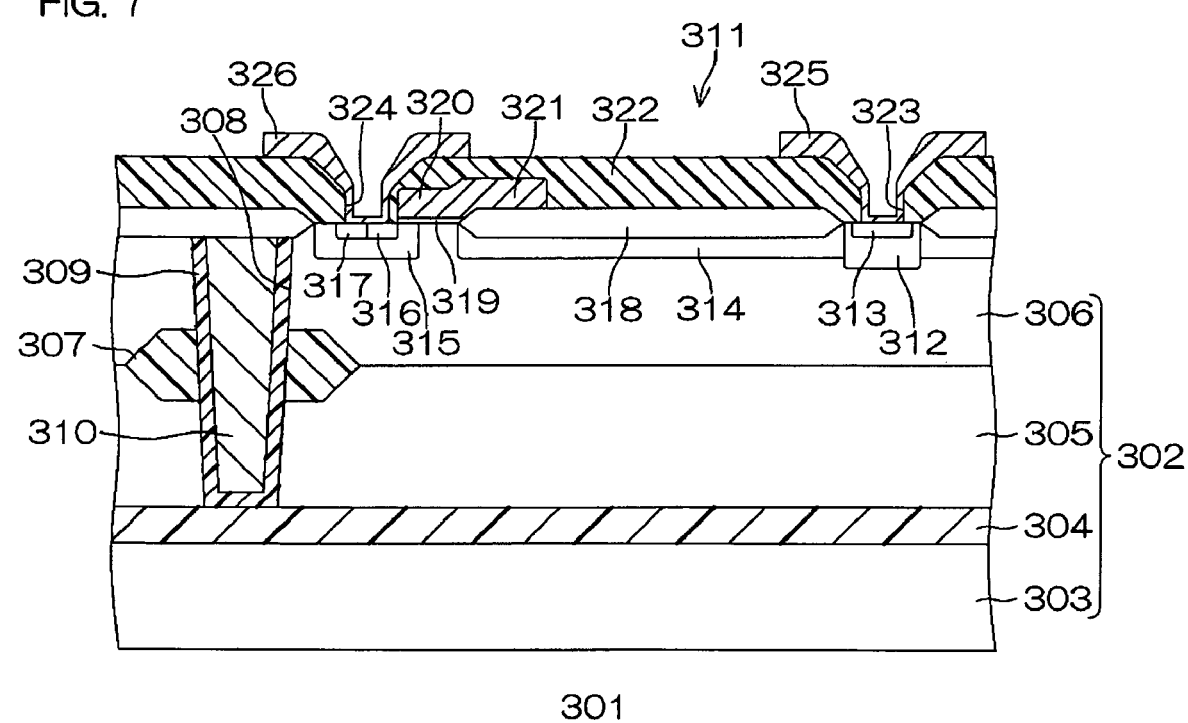
FIG. 7 is a sectional view schematically showing the structure of a semiconductor device according to a fourth embodiment of the present invention.

FIG. 7 is a schematic sectional view showing a semiconductor device according to a fourth embodiment of the present invention.

The semiconductor device 301 includes a thick-film SOI substrate 302. The thick-film SOI substrate 302 has a structure obtained by laminating N-type first and second silicon layers 305 and 306 made of Si on a P- or N-type silicon substrate 303 in this order through a BOX layer 304 made of $SiO_2$.

A stress relaxation layer 307 made of $SiO_2$ is selectively formed on the interface between the first and second silicon layers 305 and 306. More specifically, the stress relaxation layer 307 is formed in a quadrangular ring-shaped region including a region for forming a trench 308 described below in plan view.

The trench 308 quadrangular ring-shaped in plan view is formed in the first silicon layer 305, the stress relaxation layer 307 and the second silicon layer 306 to penetrate through these layers 305, 307 and 306 in the thickness direction. That is, the quadrangular ring-shaped trench 308 having a depth for reaching the BOX layer 304 from the surface of the second silicon layer 306 and a width smaller than that of the stress relaxation layer 307 is formed in the quadrangular ring-shaped region provided with the stress relaxation layer 307 in plan view. The inner surfaces of the trench 308 are covered with an $SiO_2$ film 309. The inner portion of the $SiO_2$ film 309 is filled up with polysilicon 310. Thus, a region surrounded by the trench 308 forms an element forming region 311 isolated (dielectrically isolated) from the periphery thereof by the BOX layer 304 and the $SiO_2$ film 309. A high withstand voltage MOSFET is formed on this element forming region 311, as described below.

In the element forming region 311, a P-type drain buffer region 312 is formed at the center of a surface layer portion of the second silicon layer 306 in plan view. A P-type drain contact region 313 having a higher P-type impurity concentration than the drain buffer region 312 is formed on a surface layer portion of the drain buffer region 312.

A P-type drift region 314 is formed around the drain buffer region 312. The drift region 314 is in contact with the drain buffer region 312.

On a surface layer portion of the second silicon layer 306, an N-type body region 315 is formed between the deep trench 308 and the drift region 314 at intervals from the same. A P-type source region 316 and an N-type body contact region 317 having a higher N-type impurity concentration than the body region 315 are formed on a surface layer portion of the body region 315 adjacently to each other.

A LOCOS oxide film 318 is formed on the overall drift region 314. Between the source region 316 and the LOCOS oxide film 318, a gate oxide film 319 is formed on the surface of the second silicon layer 306. A gate electrode 320 is formed on the gate oxide film 319. On the LOCOS oxide film 318, a field plate 321 is formed integrally with the gate electrode 320.

An upper portion of the thick-film SOI substrate 302 is covered with an interlayer dielectric film 322 made of $SiO_2$. A drain contact hole 323 facing the drain contact region 313 and a source contact hole 324 facing the source region 316 and the body contact region 317 are penetratingly formed in the interlayer dielectric film 322.

A drain wire 325 and a source wire 326 are formed on the interlayer dielectric film 322. The drain wire 325 is connected to the drain contact region 313 through the drain contact hole 323. The source wire 326 is connected to the source region 316 and the body contact region 317 through the source contact hole 324.

FIGS. 8A to 8G are schematic sectional views successively showing the steps of manufacturing the semiconductor device 301.

Figure 8A:
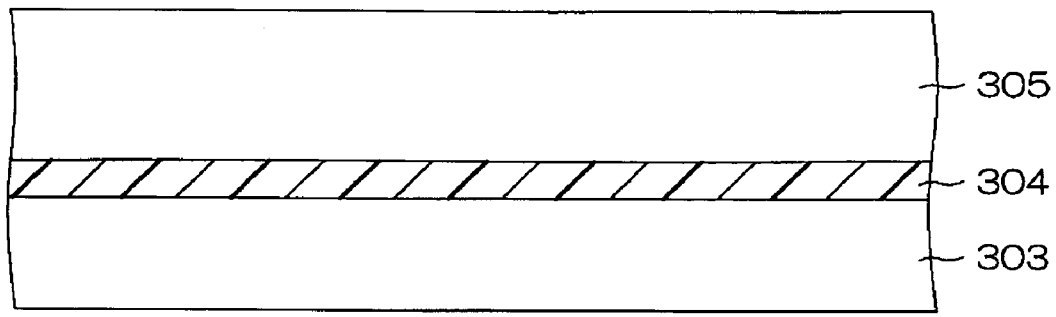
FIG. 8A is a schematic sectional view for describing a method of manufacturing the semiconductor device shown in FIG. 7.

First, a silicon substrate 303 having the BOX layer 304 is prepared, and the first silicon layer 305 is formed on the BOX layer 304 by epitaxy, as shown in FIG. 8A.

Figure 8B:
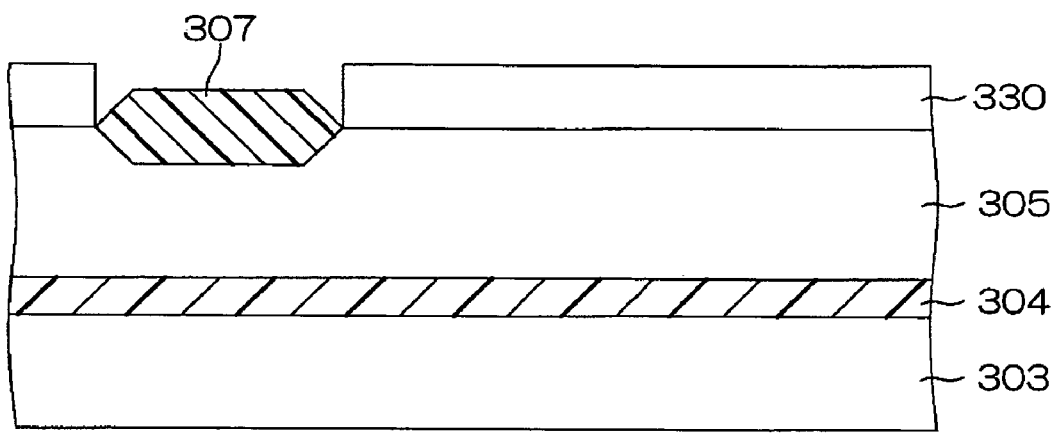
FIG. 8B is a schematic sectional view of a step subsequent to that of FIG. 8A.

Then, a hard mask 330 having an opening opposed to a portion for forming the stress relaxation layer 307 is formed on the first silicon layer 305, as shown in FIG. 8B. Then, the stress relaxation layer 307 is formed by thermally oxidizing a portion of the first silicon layer 305 exposed from the opening of the hard mask 330. After the formation of the stress relaxation layer 307, the hard mask 330 is removed.

Figure 8C:
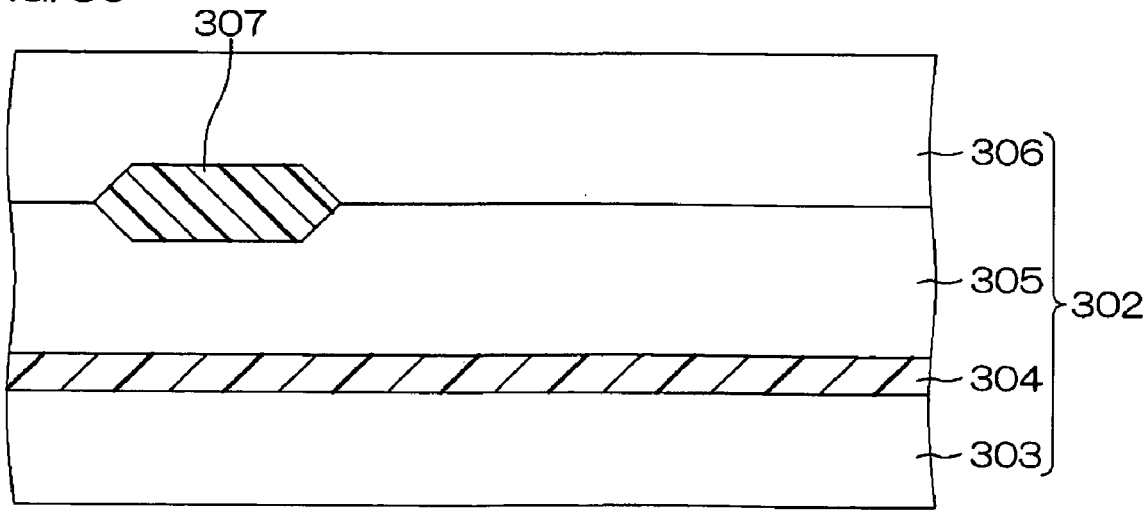
FIG. 8C is a schematic sectional view of a step subsequent to that of FIG. 8B.

Thereafter the second silicon layer 306 is formed on the first silicon layer 305 and the stress relaxation layer 307 by epitaxy, as shown in FIG. 8C.

Figure 8D:
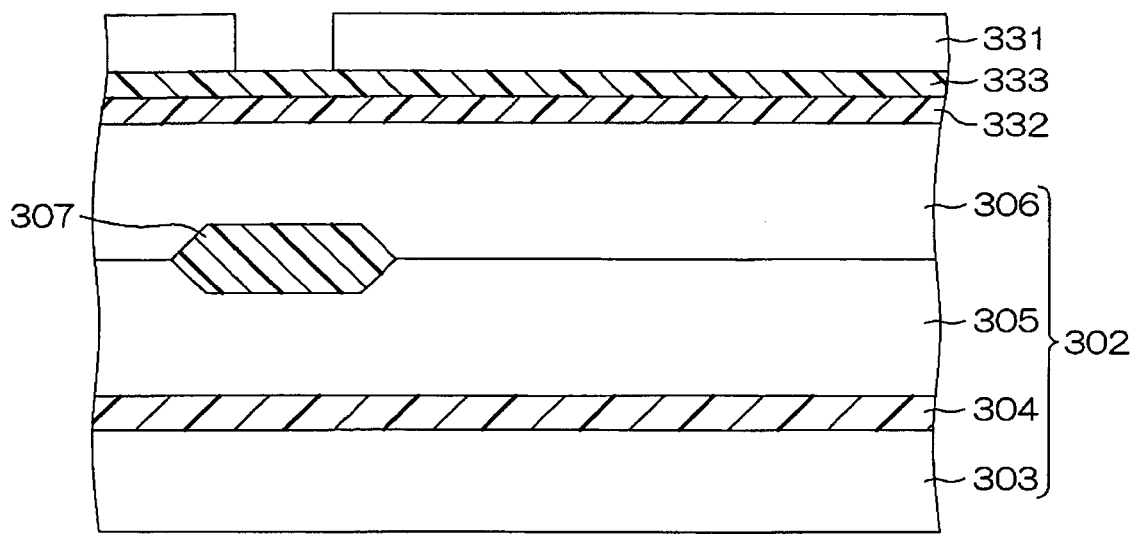
FIG. 8D is a schematic sectional view of a step subsequent to that of FIG. 8C.

Then, an SiN layer 332 and an $SiO_2$ layer 333 are formed on the second silicon layer 306 in this order from the side of the thick-film SOI substrate 302, as shown in FIG. 8D. Thereafter a resist film 331 having an opening opposed to a portion for forming the trench 308 is formed on the $SiO_2$ layer 333.

Figure 8E:
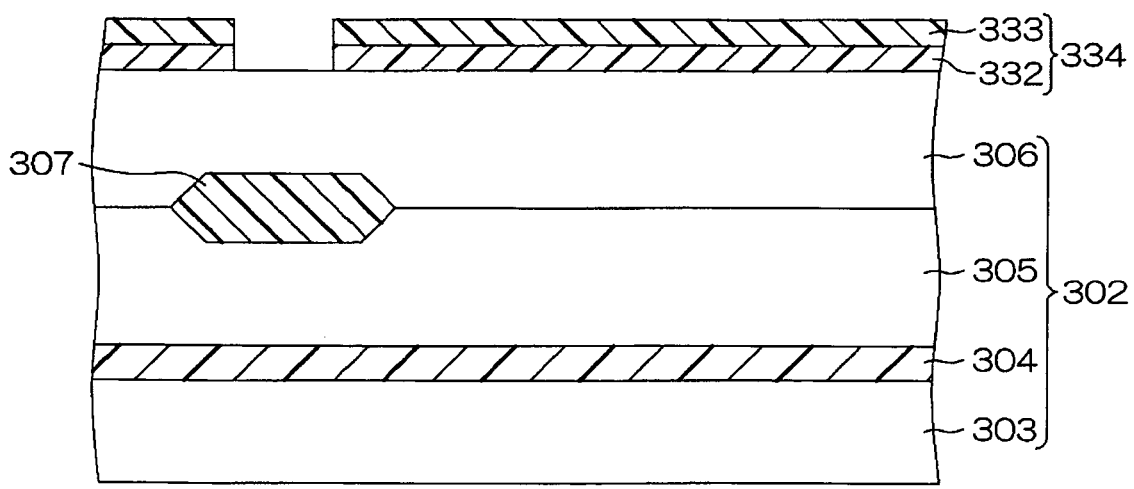
FIG. 8E is a schematic sectional view of a step subsequent to that of FIG. 8D.

The SiN layer 332 and the $SiO_2$ layer 333 are dry-etched through the resist film 331 serving as a mask, whereby a hard mask 334 having an opening opposed to the portion for forming the trench 308 is formed as shown in FIG. 8E. After the formation of the hard mask 334, the resist film 331 is removed.

Figure 8F:
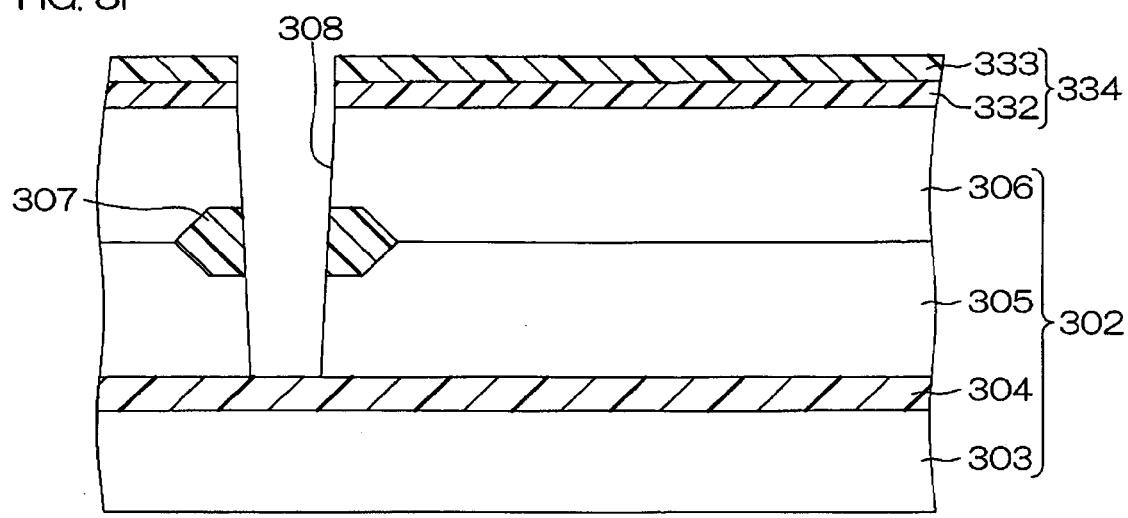
FIG. 8F is a schematic sectional view of a step subsequent to that of FIG. 8E.

Thereafter the second silicon layer 306, the stress relaxation layer 307 and the first silicon layer 305 are dry-etched through the hard mask 334, whereby the trench 308 is formed as shown in FIG. 8F. At this time, the second silicon layer 306, the stress relaxation layer 307 and the first silicon layer 305 are continuously etched by switching reaction gas (etchant) at proper timing. The etching of the first silicon layer 305 is stopped when the BOX layer 304 is exposed.

Figure 8G:
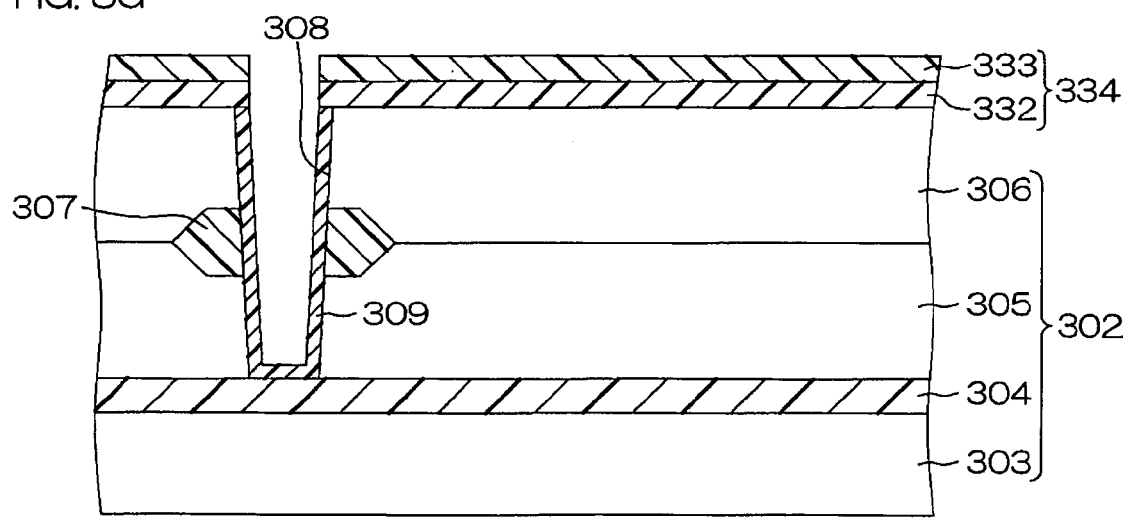
FIG. 8G is a schematic sectional view of a step subsequent to that of FIG. 8F.
Figure 9:
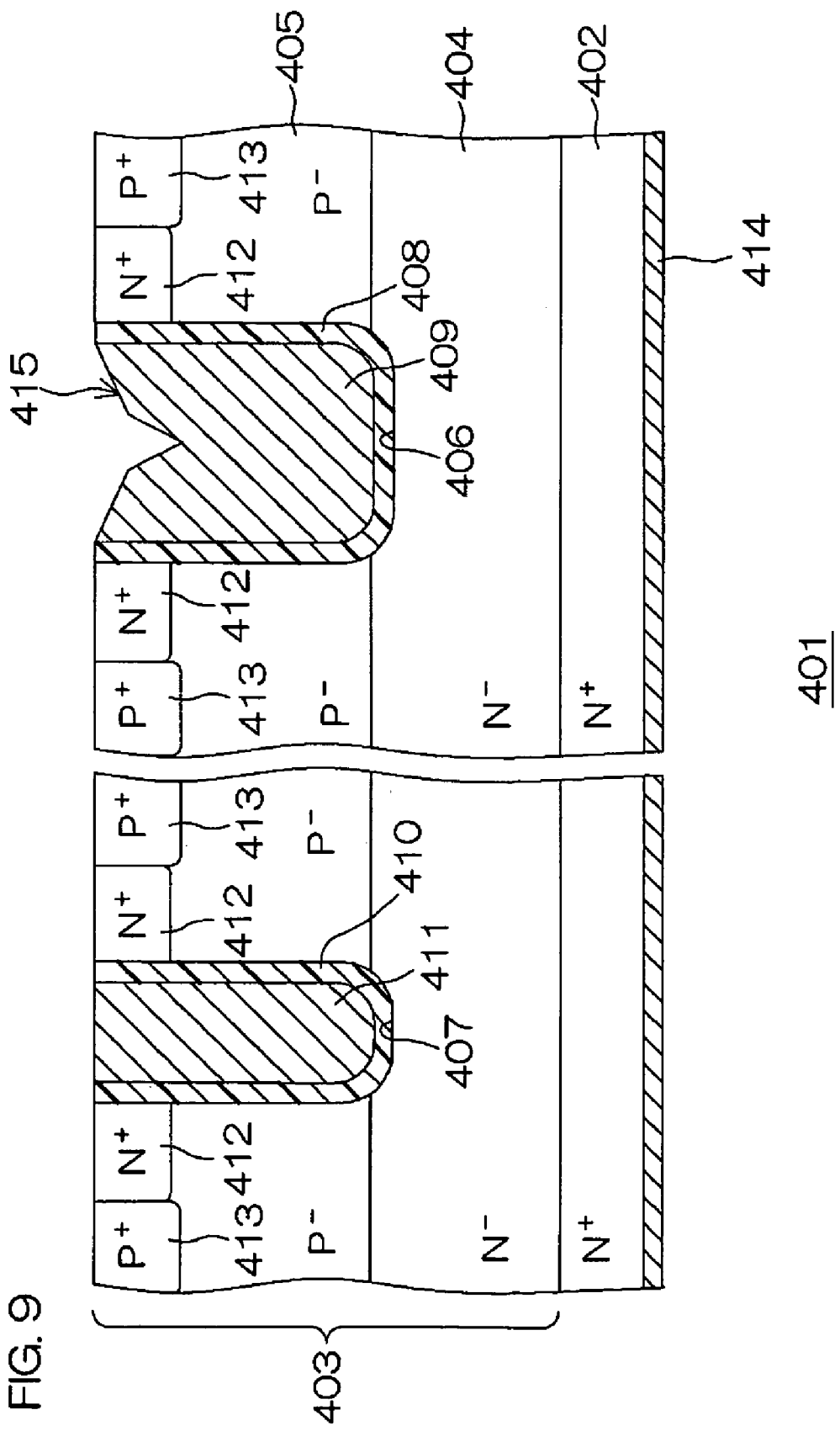
FIG. 9 is a schematic sectional view showing the structure of a conventional semiconductor device including a trench gate type VDMOSFET.
Figure 10:
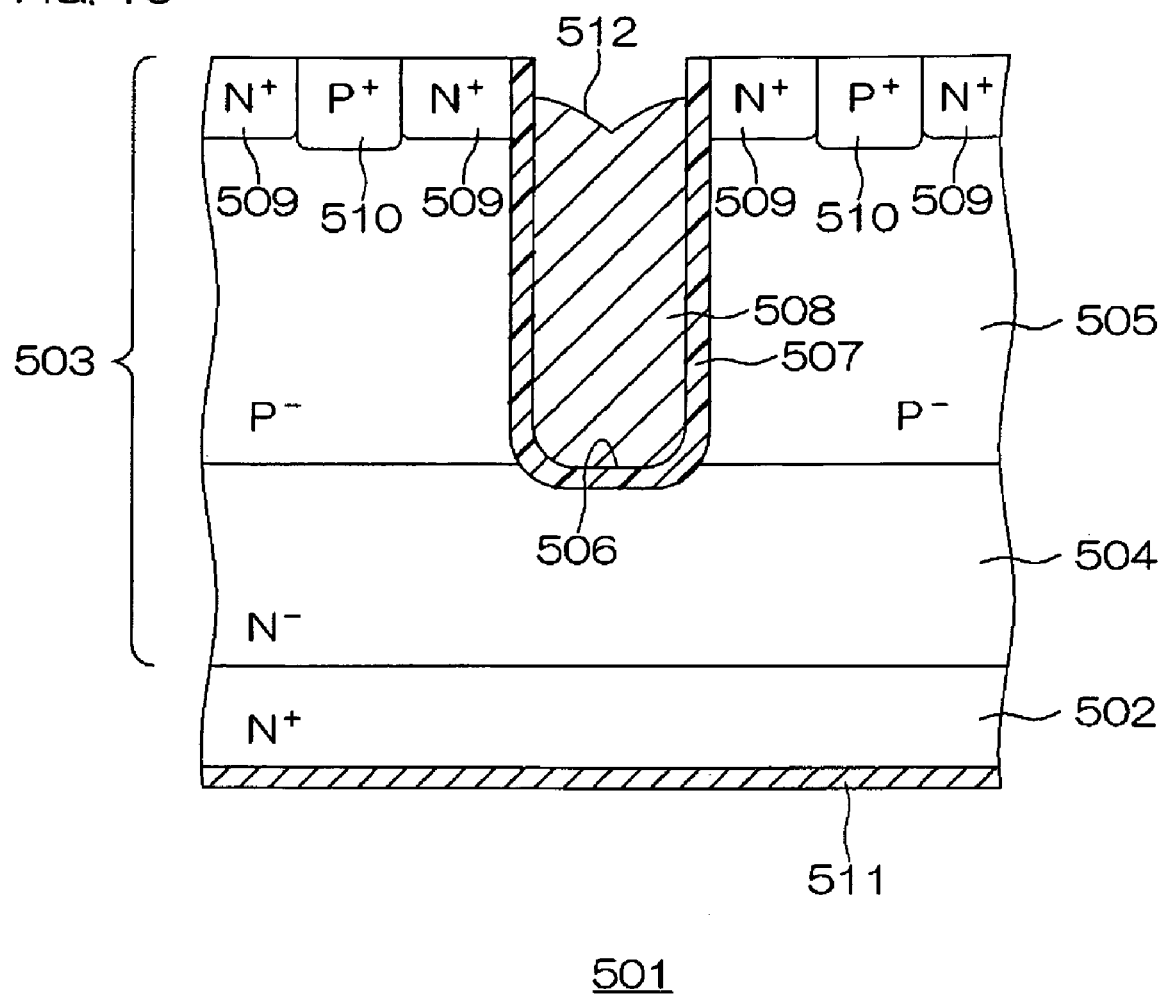
FIG. 10 is a schematic sectional view showing the structure of another conventional semiconductor device including a trench gate type VDMOSFET.
Figure 11:
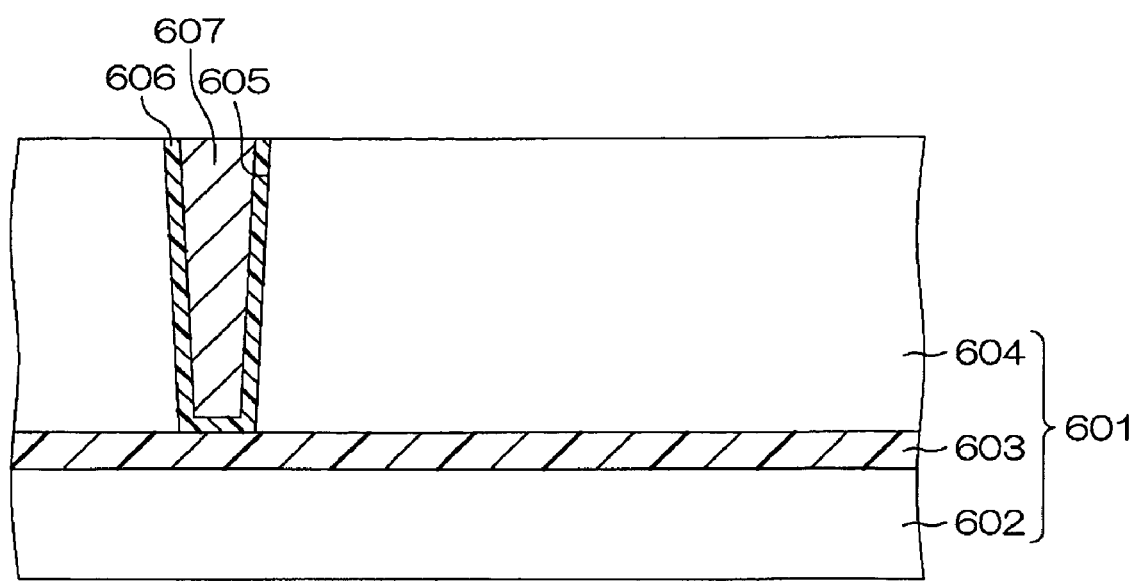
FIG. 11 is a schematic sectional view showing the structure of a conventional semiconductor substrate including a high withstand voltage element.

Thereafter the $SiO_2$ film 309 is formed on the side surfaces and the bottom surface of the trench 308 by thermal oxidation or CVD (Chemical Vapor Deposition), as shown in FIG. 8G.

Then, the polysilicon 310 is deposited on the $SiO_2$ film 309 by CVD. This polysilicon 310 is formed with a thickness for filling up the trench 308. Thereafter the polysilicon 310 is subjected to overall dry etching until portions of the polysilicon 310 located outside the trench 308 are entirely removed and the surface of the polysilicon 310 left in the trench 308 is flush with the surface of the second silicon layer 306. Thereafter the $SiO_2$ layer 333 is subjected to surface washing and overall dry etching, to be removed. This overall dry etching is continued until the surface of the SiN layer 332 is exposed. Thereafter the SiN layer 332 is removed by wet etching. Thus, the polysilicon 310 embedded in the trench 308 through the $SiO_2$ film 309 is obtained with the surface generally flush with that of the second silicon layer 306, as shown in FIG. 8H.

Thereafter the LOCOS oxide film 318 is selectively formed on a surface layer portion of the second silicon layer 306 by LOCOS oxidation. Then, the drain buffer region 312, the drain contact region 313, the drift region 314, the body region 315, the source region 316 and the body contact region 317 are formed by repeating impurity implantation into a surface layer portion of the second silicon layer 306 in the element forming region 311 and a heat treatment. Further, the gate oxide film 319, the gate electrode 320, the field plate 321, the interlayer dielectric film 322, the drain contact hole 323, the source contact hole 324, the drain wire 325 and the source wire 326 are formed by CVD, photolithography and etching, to obtain the semiconductor device 301, as shown in FIG. 7.

As hereinabove described, the second silicon layer 306 is laminated on the first silicon layer 305. The stress relaxation layer 307 is formed on the interface between the first and second silicon layers 305 and 306. The trench 308 is dug in the second silicon layer 306 from the upper surface thereof, to penetrate through the stress relaxation layer 307. The inner surfaces of the trench 308 are covered with the $SiO_2$ film 309.

In the steps of manufacturing the semiconductor device 301, heat treatments for activating the impurities and heat treatments (thermal oxidation) for forming the oxide films 318 and 319 are performed. In these heat treatments, the first and second silicon layers 305 and 306, the stress relaxation layer 307 and the $SiO_2$ film 309 are expanded/contracted. At this time, difference is caused between the quantities of expansion of the first and second silicon layers 305 and 306 and the $SiO_2$ film 309 due to the difference between the thermal expansion coefficients of Si forming the first and second silicon layers 305 and 306 and $SiO_2$ forming the $SiO_2$ film 309. However, the stress relaxation layer 307 made of $SiO_2$ is so interposed between the first and second silicon layers 305 and 306 that the difference between the quantities of expansion is absorbed due to expansion of the stress relaxation layer 307. Therefore, the first and second silicon layers 305 and 306 can be prevented from application of stress resulting from the difference between the quantities of expansion of the first and second silicon layers 305 and 306 and the $SiO_2$ film 309.

Further, the stress relaxation layer 307 partitions the interfaces between the first and second silicon layers 305 and 306 and the $SiO_2$ film 309. Even if the stress relaxation layer 307 cannot completely absorb the difference between the quantities of expansion of the first and second silicon layers 305 and 306 and the $SiO_2$ film 309, therefore, stress resulting from the difference between the quantities of expansion is dispersively applied to portions in the vicinity of the interfaces between a surface layer portion and a base layer portion of the first silicon layer 305 and the $SiO_2$ film 309 and those in the vicinity of the interfaces between a surface layer portion and a base layer portion of the second silicon layer 306 and the $SiO_2$ film 309.

Thus, formation of crystal defects resulting from stress concentration in the first and second silicon layers 305 and 306 can be prevented.

The stress relaxation layer 307 made of $SiO_2$ can be easily formed by selectively oxidizing the surface of the first silicon layer 305.

While the stress relaxation layer 307 is formed on the quadrangular ring-shaped region including the region for forming the trench 308 in plan view in this embodiment, the present invention is not restricted to this but stress relaxation layers 307 may alternatively be formed on a plurality of positions at intervals in the circumferential direction of the quadrangular ring-shaped region for forming the trench 308.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-313689 filed with the Japan Patent Office on Dec. 4, 2007, Japanese Patent Application No. 2007-329116 filed therewith on Dec. 20, 2007, and Japanese Patent Application No. 2007-332681 filed therewith on Dec. 25, 2007, the disclosures of these applications are incorporated herein by reference.

What is claimed is:

1. A semiconductor device comprising:
   a semiconductor layer made of silicon;
   a trench formed by digging the semiconductor layer from a surface thereof;
   a gate insulating film made of silicon oxide formed on an inner surface of the trench;
   a gate electrode, made of silicon doped with an impurity, embedded in the trench through the gate insulating film, the gate electrode including a protrusion formed on a surface of the gate electrode, the protrusion having a single-peaked profile in a cross section with a highest peak at a center thereof; and
   a gate wire connected to the gate electrode only at the protrusion.

2. The semiconductor device according to claim 1, wherein the protrusion protrudes outward from an inner portion of the trench, so that a forward end thereof reaches a portion located outside the trench.

3. The semiconductor device according to claim 2, wherein the gate wire is in contact with only the portion of the protrusion outside the trench.

4. The semiconductor device according to claim 1, further comprising an interlayer dielectric film formed on the semiconductor layer and having a gate contact hole opposite the protrusion, the gate contact hole having a depth such that the protrusion is exposed at a bottom of the gate contact hole, wherein
   the gate wire is formed on the interlayer dielectric film and enters into the gate contact hole to be connected with the protrusion.

5. The semiconductor device according to claim 4, wherein the gate contact hole has the depth such that the bottom thereof is generally flush with the surface of the semiconductor layer.

6. The semiconductor device according to claim 4, wherein the gate contact hole is narrower than the trench in the cross section, and enters into the trench to be in contact with the portion of the protrusion outside the trench.

7. A semiconductor device comprising:
   a semiconductor layer made of silicon;
   a trench formed in the semiconductor layer;
   a gate insulating film made of silicon oxide formed on an inner surface of the trench;
   an interlayer dielectric film formed on the semiconductor layer and having a gate contact hole aligned with the trench;
   a gate electrode, made of silicon doped with an impurity, embedded in the trench on the gate insulating film, and including a protrusion protruding upward from an inner portion of the trench towards the gate contact hole and with a highest peak at a center thereof; and
   a gate wire connected to the gate electrode at the protrusion via the gate contact hole.

* * * * *